United States Patent
Komatsu et al.

(10) Patent No.: US 12,255,629 B2
(45) Date of Patent: Mar. 18, 2025

(54) RAISED FRAME BULK ACOUSTIC WAVE DEVICES

(71) Applicant: Skyworks Global Pte. Ltd., Singapore (SG)

(72) Inventors: Tomoya Komatsu, Irvine, CA (US); Yiliu Wang, Irvine, CA (US); Takashi Hayashi, Suita (JP); Hironori Sano, Osaka (JP); Rei Goto, Osaka (JP); Kwang Jae Shin, Yongin (KR)

(73) Assignee: Skyworks Global Pte. Ltd., Singapore (SG)

( * ) Notice: Subject to any disclaimer, the term of this patent is extended or adjusted under 35 U.S.C. 154(b) by 408 days.

(21) Appl. No.: 17/703,863

(22) Filed: Mar. 24, 2022

(65) Prior Publication Data

US 2022/0311410 A1    Sep. 29, 2022

Related U.S. Application Data

(60) Provisional application No. 63/166,100, filed on Mar. 25, 2021, provisional application No. 63/166,126, filed on Mar. 25, 2021.

(51) Int. Cl.
| | |
|---|---|
| *H03H 9/56* | (2006.01) |
| *H03H 9/02* | (2006.01) |
| *H03H 9/05* | (2006.01) |
| *H03H 9/13* | (2006.01) |
| *H03H 9/205* | (2006.01) |

(52) U.S. Cl.
CPC ........ *H03H 9/568* (2013.01); *H03H 9/02157* (2013.01); *H03H 9/0504* (2013.01); *H03H 9/13* (2013.01); *H03H 9/131* (2013.01); *H03H 9/205* (2013.01)

(58) Field of Classification Search
CPC .. H03H 9/568; H03H 9/02157; H03H 9/0504; H03H 9/13; H03H 9/131; H03H 9/205; H03H 9/02118; H03H 9/173; H03H 9/175
USPC .......................................... 333/133, 186–188
See application file for complete search history.

(56) References Cited

U.S. PATENT DOCUMENTS

| | | | |
|---|---|---|---|
| 9,490,771 B2 | 11/2016 | Burak et al. | |
| 9,660,609 B2 | 5/2017 | Reisner et al. | |
| 10,250,228 B2 | 4/2019 | Chang et al. | |
| 10,886,888 B2 | 1/2021 | Ivira et al. | |

(Continued)

FOREIGN PATENT DOCUMENTS

WO    WO 2020/199505    10/2020

*Primary Examiner* — Jorge L Salazar, Jr.
(74) *Attorney, Agent, or Firm* — Knobbe, Martens, Olson & Bear, LLP

(57) ABSTRACT

Aspects of this disclosure relate to bulk acoustic wave devices that have a raised frame structure, and filters that utilize the bulk acoustic wave devices. The raised frame structure can include a first raised frame layer that has a relatively low acoustic impedance. The raised frame structure can include a second raised frame layer that has a relatively high acoustic impedance. The first raised frame layer can extend inward further than the second raised frame layer. A width of the first raised frame layer that overlaps the first and second electrodes is between about 1.5 times to about 4 times larger than the combined thickness of the first electrode, the piezoelectric layer, and the second electrode.

24 Claims, 18 Drawing Sheets

(56) References Cited

U.S. PATENT DOCUMENTS

| | | |
|---|---|---|
| 11,764,750 B2 | 9/2023 | Hou et al. |
| 2011/0298564 A1* | 12/2011 | Iwashita ............... H03H 9/173 333/187 |
| 2015/0280687 A1 | 10/2015 | Burak et al. |
| 2016/0126930 A1 | 5/2016 | Zou et al. |
| 2016/0163954 A1 | 6/2016 | Shin et al. |
| 2016/0227603 A1 | 8/2016 | Huang et al. |
| 2017/0244021 A1* | 8/2017 | Han ...................... H10N 30/87 |
| 2019/0182894 A1 | 6/2019 | Huang et al. |
| 2020/0099359 A1 | 3/2020 | Shin et al. |
| 2020/0274515 A1 | 8/2020 | Shin et al. |
| 2020/0373901 A1 | 11/2020 | Liu et al. |
| 2020/0373911 A1 | 11/2020 | Wang et al. |
| 2020/0395911 A1 | 12/2020 | Liu et al. |
| 2021/0028751 A1 | 1/2021 | Hurwitz et al. |
| 2021/0028765 A1 | 1/2021 | Wang et al. |
| 2021/0083643 A1 | 3/2021 | Liu et al. |
| 2021/0111692 A1 | 4/2021 | Liu et al. |
| 2021/0126619 A1 | 4/2021 | Wang et al. |
| 2021/0126625 A1 | 4/2021 | Wang et al. |
| 2021/0344321 A1 | 11/2021 | Shin et al. |
| 2022/0094323 A1 | 3/2022 | Zhang et al. |
| 2022/0094324 A1 | 3/2022 | Zhang et al. |
| 2022/0094335 A1 | 3/2022 | Zhang et al. |
| 2022/0103150 A1 | 3/2022 | Shin et al. |
| 2022/0103151 A1 | 3/2022 | Shin et al. |
| 2022/0103152 A1 | 3/2022 | Shin et al. |
| 2022/0103159 A1 | 3/2022 | Shin et al. |
| 2022/0200571 A1 | 6/2022 | Wang et al. |
| 2022/0200572 A1 | 6/2022 | Wang et al. |
| 2022/0209743 A1 | 6/2022 | Liu et al. |
| 2022/0209747 A1 | 6/2022 | Wang et al. |
| 2022/0209749 A1 | 6/2022 | Wang et al. |
| 2022/0311410 A1 | 9/2022 | Komatsu et al. |
| 2022/0311411 A1 | 9/2022 | Liu et al. |
| 2022/0311412 A1 | 9/2022 | Liu et al. |
| 2022/0311419 A1 | 9/2022 | Komatsu et al. |
| 2022/0368312 A1 | 11/2022 | Wang et al. |
| 2023/0105560 A1 | 4/2023 | Shin et al. |
| 2023/0106034 A1 | 4/2023 | Shin et al. |

* cited by examiner

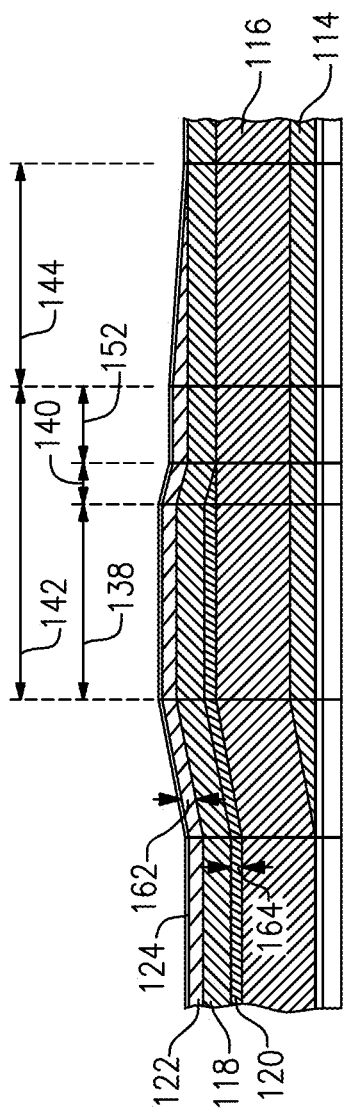
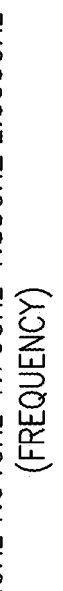
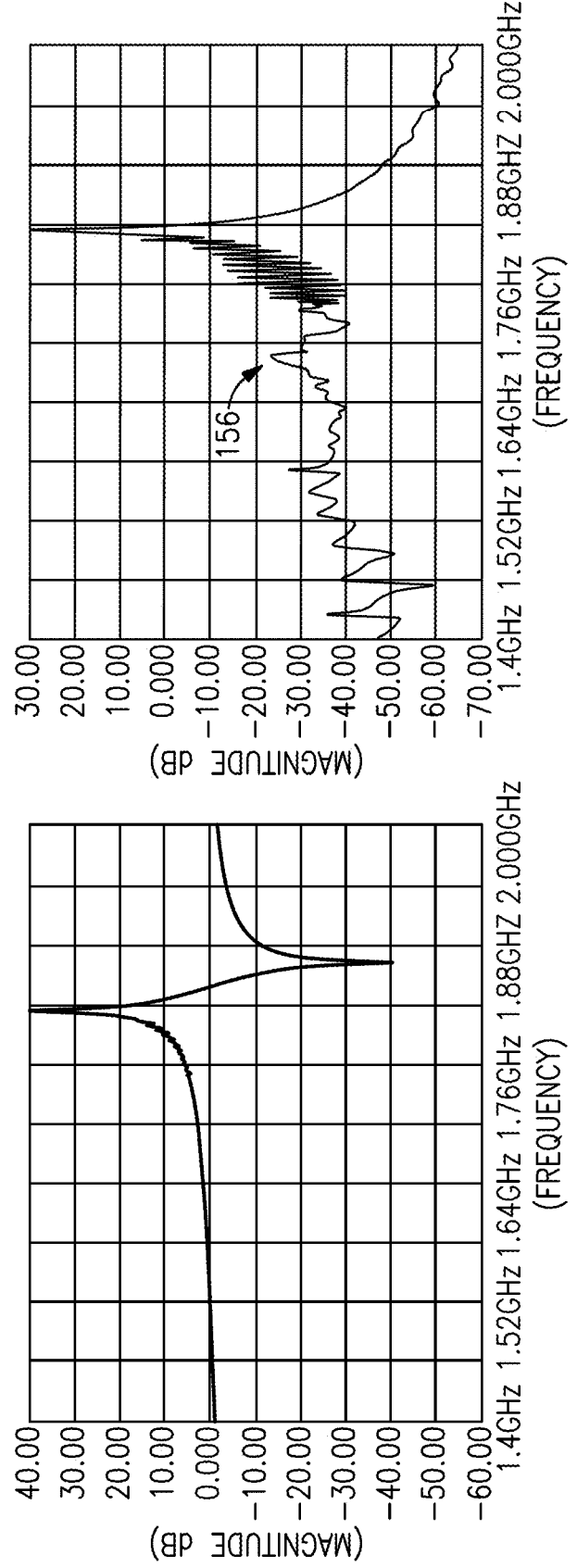
FIG.8
FIG.9
FIG.10

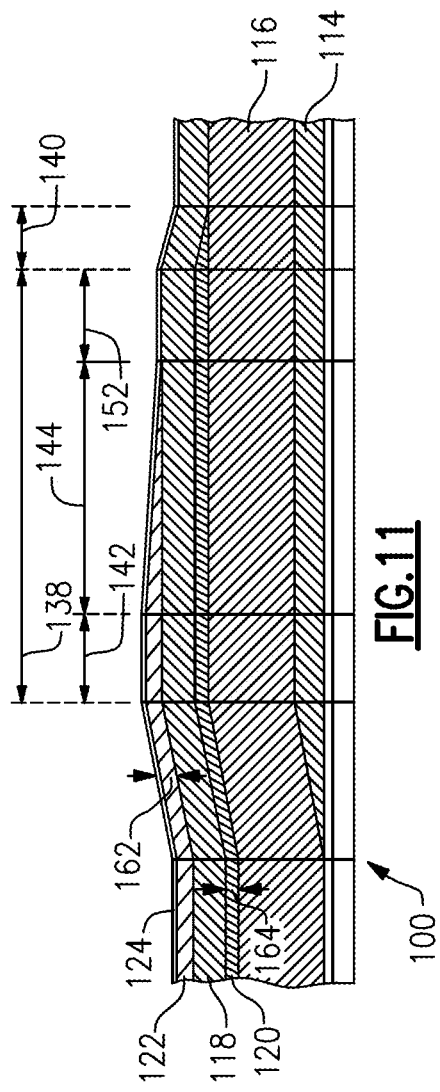
FIG.11
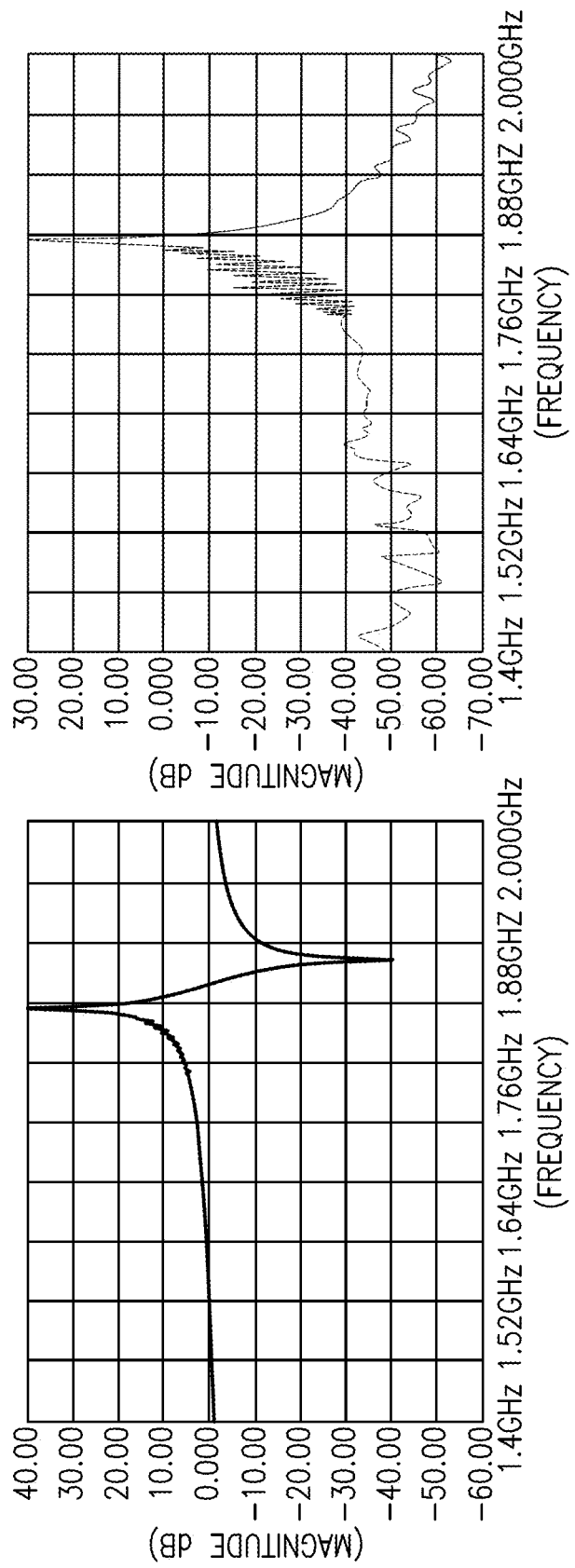
FIG.13
FIG.12

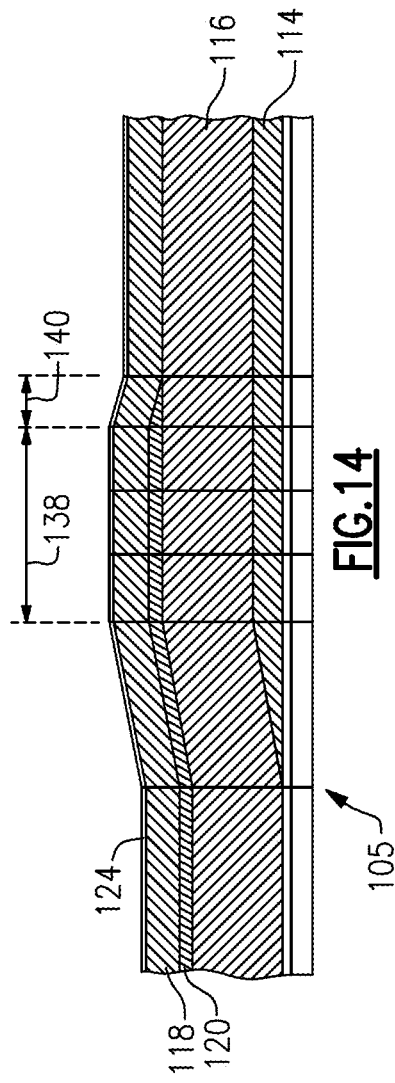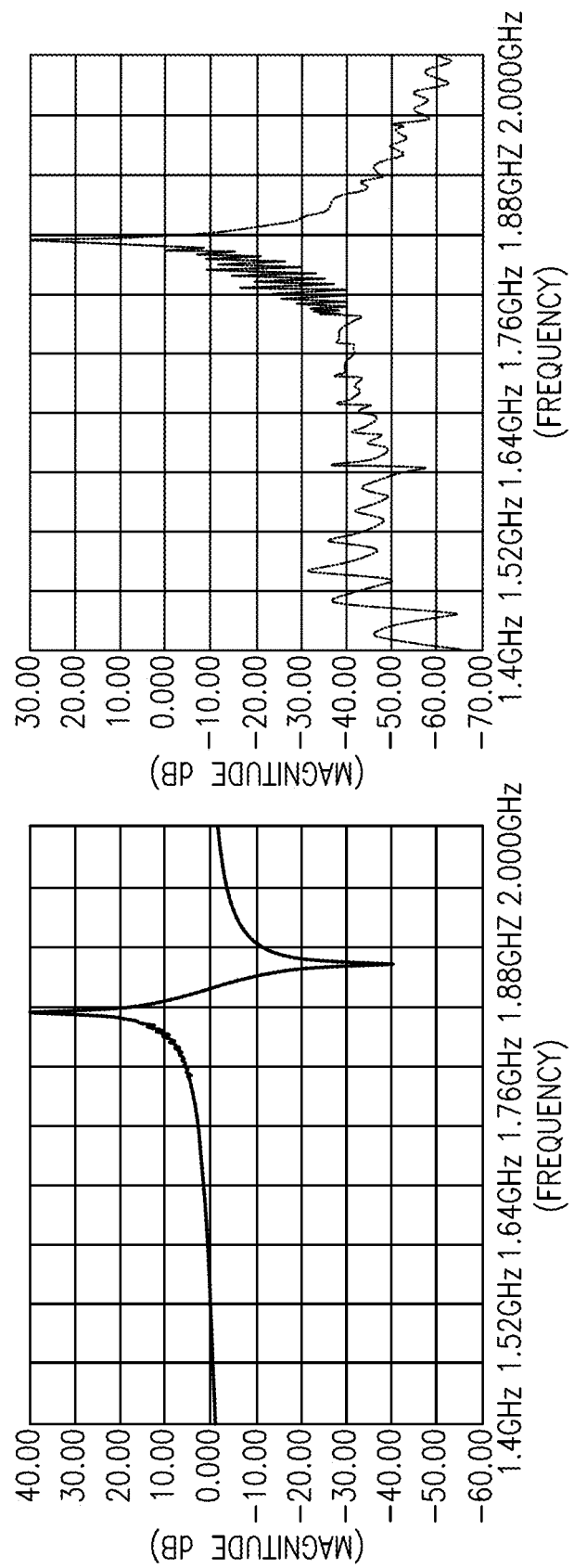

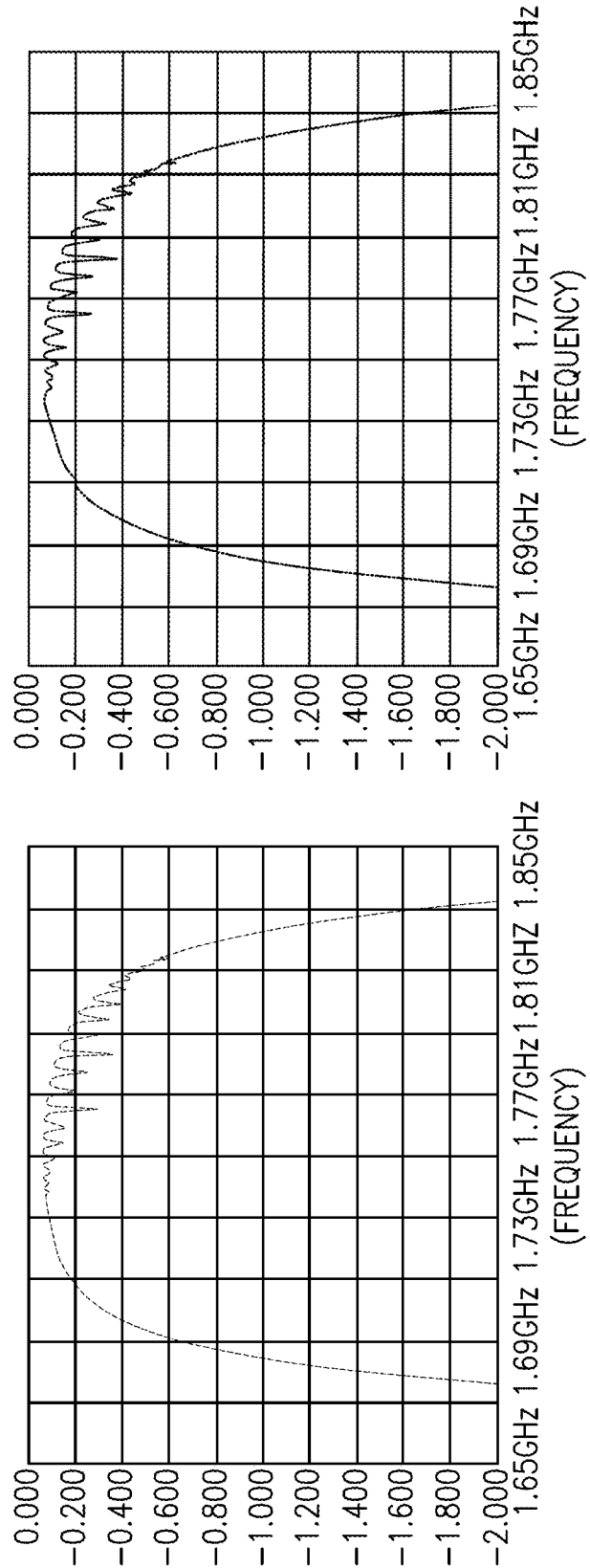

RAISED FRAME BULK ACOUSTIC WAVE DEVICES

CROSS REFERENCE TO PRIORITY APPLICATIONS

This application claims the benefit of priority of U.S. Provisional Patent Application No. 63/166,100, filed Mar. 25, 2021 and titled "RAISED FRAME BULK ACOUSTIC WAVE DEVICES," and also claims the benefit of priority of U.S. Provisional Patent Application No. 63/166,126, filed Mar. 25, 2021 and titled "FILTERS WITH RAISED FRAME BULK ACOUSTIC WAVE DEVICES," the entire contents of each of which are hereby incorporated by reference herein.

BACKGROUND

Field of the Disclosure

Some embodiments disclosed herein relate to acoustic wave devices, such as bulk acoustic wave devices, and to filters that include bulk acoustic wave devices.

Description of the Related Art

Acoustic wave filters can be implemented in radio frequency electronic systems. For example, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. BAW filters can include BAW resonators. In BAW resonators, acoustic waves propagate in a bulk of a piezoelectric layer. Example BAW resonators include film bulk acoustic wave resonators (FBARs) and solidly mounted resonators (SMRs).

Although various BAW devices exist, there remains a need for improved BAW devices and filters.

SUMMARY OF CERTAIN ASPECTS

Certain example aspects are summarized below for illustrative purposes. The innovations are not limited to the specific implementations recited herein. The innovations described herein can have several novel aspects, no single one of which is solely responsible for its desirable attributes or essential.

Various embodiments disclosed herein can relate to a bulk acoustic wave device that includes a first electrode, a second electrode, a piezoelectric layer between the first electrode and the second electrode, and a raised frame structure that includes a first raised frame layer and a second raised frame layer. The second raised frame layer can have a higher acoustic impedance than the first raised frame layer. The second raised frame layer can overlapping a portion of the first raised frame layer. The first raised frame layer can extend further inward than the second raised frame layer.

The first raised frame layer can extend further inward than the second raised frame layer by a distance that is between about 50% and about 100% of the combined thickness of the first electrode, the piezoelectric layer, and the second electrode. The first raised frame layer can extend further inward than the second raised frame layer by a distance that is between about 60% and about 90% of the combined thickness of the first electrode, the piezoelectric layer, and the second electrode.

The first raised frame layer can include a non-gradient portion with a substantially uniform thickness and a gradient portion with a tapered thickness. The non-gradient portion of the first raised frame layer can extend further inward than the second raised frame layer. The non-gradient portion of the first raised frame layer can have a width that is larger than a combined thickness of the first electrode, the piezoelectric layer, and the second electrode. The non-gradient portion of the first raised frame layer can be between about 1.5 and about 2.5 times larger than the combined thickness of the first electrode, the piezoelectric layer, and the second electrode. The second raised frame layer can include a non-gradient portion with a substantially uniform thickness and a gradient portion with a tapered thickness. The non-gradient portion of the first raised frame layer can be wider than the non-gradient portion of the second raised frame layer. The non-gradient portion of the first raised frame layer can be about 2 times to about 8 times wider than the non-gradient portion of the second raised frame layer. The non-gradient portion of the first raised frame layer can be about 4 times to about 6 times wider than the non-gradient portion of the second raised frame layer. The non-gradient portion of the first raised frame layer can be about 4.5 times to about 5.5 times wider than the non-gradient portion of the second raised frame layer. A gradient angle of the gradient portion of the first raised frame layer can be larger than a gradient angle of the gradient portion of the second raised frame layer. A width of the gradient portion of the first raised frame layer can be less than a width of the gradient portion of the second raised frame layer. The non-gradient portion of the first raised frame layer extends further inward than the gradient portion of the second raised frame layer by a distance that is between about 25% and about 75% of the combined thickness of the first electrode, the piezoelectric layer, and the second electrode. The non-gradient portion of the first raised frame layer can extend further inward than the gradient portion of the second raised frame layer by a distance that is between about 35% and about 60% of the combined thickness of the first electrode, the piezoelectric layer, and the second electrode. The non-gradient portion of the first raised frame layer can extend further inward than the gradient portion of the second raised frame layer by a distance that is between about 40% and about 45% of the combined thickness of the first electrode, the piezoelectric layer, and the second electrode.

The first raised frame layer can have a thickness between about 0.02 to about 0.4 times the combined thickness of the first electrode, the piezoelectric layer, and the second electrode. The first raised frame layer can have a thickness between about 0.06 to about 0.15 times the combined thickness of the first electrode, the piezoelectric layer, and the second electrode. The second raised frame layer can have a thickness between about 0.02 to about 0.4 times the combined thickness of the first electrode, the piezoelectric layer, and the second electrode. The second raised frame layer can have a thickness between about 0.06 to about 0.15 times the combined thickness of the first electrode, the piezoelectric layer, and the second electrode.

The bulk acoustic wave device can have an active region where the first electrode overlaps the second electrode, the active region including a middle area, and the raised frame structure positioned outside the middle area of the active region. The combined thickness of the first electrode, the piezoelectric layer, and the second electrode can be taken at the middle area of the active region. The bulk acoustic wave device can include a recessed frame region between the raised frame structure and the middle area. The bulk acoustic wave device can have a passivation layer over the first electrode, the second electrode, the piezoelectric layer, and/or the raised frame structure. The passivation layer can be thinner at the recessed frame region than at the middle area. The second raised frame layer can be thinner than the first electrode. The second raised frame layer can be thinner than the second electrode.

The first raised frame layer can be between the first electrode and the second electrode. The piezoelectric layer can be over the first electrode, the second electrode an be over the piezoelectric layer, and the first raised frame layer can be between the second electrode and the piezoelectric layer. The second raised frame layer can be over the second electrode. The piezoelectric layer can be over the first electrode, the second electrode can be over the piezoelectric layer, and the first raised frame layer can be between the first electrode and the piezoelectric layer. The second raised frame layer can be over the second electrode.

The first raised frame layer can have a lower acoustic impedance than the first electrode. The first raised frame layer can have a lower acoustic impedance than the second electrode. The first raised frame layer can have a lower acoustic impedance than the piezoelectric layer. The first raised frame layer can include silicon dioxide. The second raised frame layer can include the same material as the second electrode. The second raised frame layer can include at least one of molybdenum, tungsten, ruthenium, platinum, or iridium.

The bulk acoustic wave device can include a cavity, and the first electrode can be between the cavity and the piezoelectric layer. The bulk acoustic wave device can include an acoustic Bragg reflector, and the first electrode can be between the acoustic Bragg reflector and the piezoelectric layer.

Various embodiments disclosed herein can relate to a bulk acoustic wave device, which can include a first electrode, a second electrode, a piezoelectric layer between the first electrode and the second electrode, and a raised frame structure that includes a raised frame layer having a lower acoustic impedance than at least one of the first electrode, the second electrode, and the piezoelectric layer.

The width of the raised frame layer that overlaps the first and second electrodes can be between about 1.5 times to about 4 times larger than the combined thickness of the first electrode, the piezoelectric layer, and the second electrode. The width of the raised frame layer that overlaps the first and second electrodes can be between about 2 times to about 3 times wider than the combined thickness of the first electrode, the piezoelectric layer, and the second electrode.

The raised frame layer can include a non-gradient portion with a substantially uniform thickness and a gradient portion with a tapered thickness. The non-gradient portion of the raised frame layer can have a width that is larger than a combined thickness of the first electrode, the piezoelectric layer, and the second electrode. The non-gradient portion of the raised frame layer can be between about 1.5 and about 2.5 times larger than the combined thickness of the first electrode, the piezoelectric layer, and the second electrode. The raised frame layer can have a thickness between about 0.02 to about 0.4 times the combined thickness of the first electrode, the piezoelectric layer, and the second electrode. The raised frame layer can have a thickness between about 0.06 to about 0.15 times the combined thickness of the first electrode, the piezoelectric layer, and the second electrode.

The bulk acoustic wave device can have an active region where the first electrode overlaps the second electrode. The active region can include a middle area, and the raised frame structure can be positioned outside the middle area of the active region. The combined thickness of the first electrode, the piezoelectric layer, and the second electrode can be taken at the middle area of the active region. The bulk acoustic wave device can include a recessed frame region between the raised frame structure and the middle area. The bulk acoustic wave device can include a passivation layer over the first electrode, the second electrode, the piezoelectric layer, and/or the raised frame structure. The passivation layer can be thinner at the recessed frame region than at the middle area.

The raised frame layer can be between the first electrode and the second electrode. The piezoelectric layer can be over the first electrode. The second electrode can be over the piezoelectric layer. The raised frame layer can be between the second electrode and the piezoelectric layer. The piezoelectric layer can be over the first electrode. The second electrode can be over the piezoelectric layer. The raised frame layer can be between the first electrode and the piezoelectric layer.

The raised frame layer can have a lower acoustic impedance than the first electrode. The raised frame layer can have a lower acoustic impedance than the second electrode. The raised frame layer can have a lower acoustic impedance than the piezoelectric layer. The raised frame layer can include silicon dioxide.

The bulk acoustic wave device can include a cavity, and the first electrode can be between the cavity and the piezoelectric layer. The bulk acoustic wave device can include an acoustic Bragg reflector, and the first electrode can be between the acoustic Bragg reflector and the piezoelectric layer.

Various embodiments disclosed herein can relate to a filter (e.g., a band pass filter), which can include one or more series bulk acoustic wave (BAW) resonators that include a first raised frame structure. The first raised frame structure can have a first raised frame layer and a second raised frame layer having a higher acoustic impedance than the first raised frame layer. The second raised frame layer can overlap a portion of the first raised frame layer. The first raised frame layer can extend further inward than the second raised frame layer. The filter can include one or more shunt bulk acoustic wave (BAW) resonators that have a second raised frame structure different from the first raised frame structure.

The filter can include a plurality of the series BAW resonators that can be coupled in series between a first port and a second port. The filter can include a plurality of the shunt BAW resonators that can be coupled in parallel between the series BAW resonators and ground.

The series BAW resonators can include a first electrode, a second electrode, and a piezoelectric layer, which can be between the first electrode and the second electrode. The first raised frame layer can extend further inward than the second raised frame layer by a distance that can be between about 50% and about 100% of the combined thickness of the first electrode, the piezoelectric layer, and the second electrode. The first raised frame layer can extend further inward than the second raised frame layer by a distance that can be between about 60% and about 90% of the combined thickness of the first electrode, the piezoelectric layer, and the second electrode.

The first raised frame layer can include a non-gradient portion with a substantially uniform thickness and a gradient portion with a tapered thickness. The non-gradient portion of the first raised frame layer can extend further inward than the second raised frame layer. The non-gradient portion of the first raised frame layer can have a width that is larger than a combined thickness of the first electrode, the piezoelectric layer, and the second electrode. The non-gradient portion of the first raised frame layer can be between about 1.5 and about 2.5 times larger than the combined thickness of the first electrode, the piezoelectric layer, and the second electrode. The second raised frame layer can include a non-gradient portion with a substantially uniform thickness and a gradient portion with a tapered thickness. The non-gradient portion of the first raised frame layer can be wider than the non-gradient portion of the second raised frame layer. The non-gradient portion of the first raised frame layer can be about 2 times to about 8 times wider than the non-gradient portion of the second raised frame layer. The non-gradient portion of the first raised frame layer can be about 4 times to about 6 times wider than the non-gradient portion of the second raised frame layer. The non-gradient portion of the first raised frame layer can be about 4.5 times to about 5.5 times wider than the non-gradient portion of the second raised frame layer. A gradient angle of the gradient portion of the first raised frame layer is larger than a gradient angle of the gradient portion of the second raised frame layer. A width of the gradient portion of the first raised frame layer can be less than a width of the gradient portion of the second raised frame layer. The non-gradient portion of the first raised frame layer can extend further inward than the gradient portion of the second raised frame layer by a distance that is between about 25% and about 75% of the combined thickness of the first electrode, the piezoelectric layer, and the second electrode. The non-gradient portion of the first raised frame layer can extend further inward than the gradient portion of the second raised frame layer by a distance that is between about 35% and about 60% of the combined thickness of the first electrode, the piezoelectric layer, and the second electrode. The non-gradient portion of the first raised frame layer can extend further inward than the gradient portion of the second raised frame layer by a distance that is between about 40% and about 45% of the combined thickness of the first electrode, the piezoelectric layer, and the second electrode.

The first raised frame layer can have a thickness between about 0.02 to about 0.4 times the combined thickness of the first electrode, the piezoelectric layer, and the second electrode. The first raised frame layer can have a thickness between about 0.06 to about 0.15 times the combined thickness of the first electrode, the piezoelectric layer, and the second electrode.

The filter can include an active region where the first electrode overlaps the second electrode, the active region including a middle area. The raised frame structure can be positioned outside the middle area of the active region. The combined thickness of the first electrode, the piezoelectric layer, and the second electrode can be at the middle area of the active region.

The second raised frame layer can be thinner than the first electrode. The second raised frame layer can be thinner than the second electrode. The first raised frame layer can be between the first electrode and the second electrode. The piezoelectric layer can be over the first electrode, the second electrode can be over the piezoelectric layer, and the first raised frame layer can be between the second electrode and the piezoelectric layer. The second raised frame layer can be over the second electrode. The piezoelectric layer can be over the first electrode, the second electrode can be over the piezoelectric layer, and the first raised frame layer can be between the first electrode and the piezoelectric layer. The second raised frame layer can be over the second electrode.

The first raised frame layer can have a lower acoustic impedance than the first electrode. The first raised frame layer can have a lower acoustic impedance than the second electrode. The first raised frame layer can have a lower acoustic impedance than the piezoelectric layer. The first raised frame layer can include silicon dioxide. The second raised frame structure of the one or more shunt BAW resonators can include a first raised frame layer and a second raised frame layer having a higher acoustic impedance than the first raised frame layer. The second raised frame layer can overlap a portion of the first raised frame layer. The second raised frame layer can extend further inward than the first raised frame layer.

Various embodiments disclosed herein can relate to a filter (e.g., a band rejection filter), which can include one or more series bulk acoustic wave (BAW) resonators that include a first raised frame structure, one or more shunt bulk acoustic wave (BAW) resonators that have a second raised frame structure different from the first raised frame structure. The second raised frame structure can include a first raised frame layer and a second raised frame layer having a higher acoustic impedance than the first raised frame layer. The second raised frame layer can overlap a portion of the first raised frame layer. The first raised frame layer can extend further inward than the second raised frame layer. The filter can include a plurality of the series BAW resonators that can be coupled in series between a first port and a second port. The filter can include a plurality of the shunt BAW resonators that can be coupled in parallel between the series BAW resonators and ground. The shunt BAW resonators can include a first electrode, a second electrode, and a piezoelectric layer between the first electrode and the second electrode. The first raised frame layer can extend further inward than the second raised frame layer by a distance that is between about 50% and about 100% of the combined thickness of the first electrode, the piezoelectric layer, and the second electrode. The first raised frame layer can extend further inward than the second raised frame layer by a distance that is between about 60% and about 90% of the combined thickness of the first electrode, the piezoelectric layer, and the second electrode.

The first raised frame layer can include a non-gradient portion with a substantially uniform thickness and a gradient portion with a tapered thickness. The non-gradient portion of the first raised frame layer can extend further inward than the second raised frame layer. The non-gradient portion of the first raised frame layer can have a width that is larger than a combined thickness of the first electrode, the piezoelectric layer, and the second electrode. The non-gradient portion of the first raised frame layer can be between about 1.5 and about 2.5 times larger than the combined thickness of the first electrode, the piezoelectric layer, and the second electrode. The second raised frame layer can include a non-gradient portion with a substantially uniform thickness and a gradient portion with a tapered thickness. The non-gradient portion of the first raised frame layer is wider than the non-gradient portion of the second raised frame layer. The non-gradient portion of the first raised frame layer can be about 2 times to about 8 times wider than the non-gradient portion of the second raised frame layer. The non-gradient portion of the first raised frame layer can be about 4 times to about 6 times wider than the non-gradient portion of the second raised frame layer. The non-gradient portion of the first raised frame layer can be about 4.5 times to about 5.5 times wider than the non-gradient portion of the second raised frame layer. A gradient angle of the gradient portion of the first raised frame layer can be larger than a gradient angle of the gradient portion of the second raised frame layer. A width of the gradient portion of the first raised frame layer can be less than a width of the gradient portion of the second raised frame layer. The non-gradient portion of the first raised frame layer can extend further inward than the gradient portion of the second raised frame layer by a distance that is between about 25% and about 75% of the combined thickness of the first electrode, the piezoelectric layer, and the second electrode. The non-gradient portion of the first raised frame layer can extend further inward than the gradient portion of the second raised frame layer by a distance that is between about 35% and about 60% of the combined thickness of the first electrode, the piezoelectric layer, and the second electrode. The non-gradient portion of the first raised frame layer can extend further inward than the gradient portion of the second raised frame layer by a distance that is between about 40% and about 45% of the combined thickness of the first electrode, the piezoelectric layer, and the second electrode.

The first raised frame layer can have a thickness between about 0.02 to about 0.4 times the combined thickness of the first electrode, the piezoelectric layer, and the second electrode. The first raised frame layer can have a thickness between about 0.06 to about 0.15 times the combined thickness of the first electrode, the piezoelectric layer, and the second electrode.

The filter can have an active region where the first electrode overlaps the second electrode. The active region can have a middle area. The raised frame structure can be positioned outside the middle area of the active region. The combined thickness of the first electrode, the piezoelectric layer, and the second electrode can be at the middle area of the active region. The second raised frame layer can be thinner than the first electrode. The second raised frame layer can be thinner than the second electrode. The first raised frame layer can be between the first electrode and the second electrode. The piezoelectric layer can be over the first electrode, the second electrode can be over the piezoelectric layer, and the first raised frame layer can be between the second electrode and the piezoelectric layer. The second raised frame layer can be over the second electrode. The piezoelectric layer can be over the first electrode, the second electrode can be over the piezoelectric layer, and the first raised frame layer can be between the first electrode and the piezoelectric layer. The second raised frame layer can be over the second electrode.

The first raised frame layer can have a lower acoustic impedance than the first electrode. The first raised frame layer can have a lower acoustic impedance than the second electrode. The first raised frame layer can have a lower acoustic impedance than the piezoelectric layer. The first raised frame layer can include silicon dioxide. The second raised frame structure of the one or more series BAW resonators can include a first raised frame layer and a second raised frame layer having a higher acoustic impedance than the first raised frame layer. The second raised frame layer can overlap a portion of the first raised frame layer. The second raised frame layer can extend further inward than the first raised frame layer.

Various embodiments disclosed herein can relate to a filter that includes one or more series bulk acoustic wave (BAW) resonators that include a first raised frame structure and one or more shunt bulk acoustic wave (BAW) resonators that have a second raised frame structure different from the first raised frame structure. The first raised frame structure or the second raised frame structure can include a raised frame layer having a lower acoustic impedance than at least one of a first electrode, a second electrode, and a piezoelectric layer of the corresponding BAW resonator. A width of the raised frame layer that overlaps the first and second electrodes can be between about 1.5 times to about 4 times larger than the combined thickness of the first electrode, the piezoelectric layer, and the second electrode.

The first raised frame structure can have the raised frame layer. The filter can be a band pass filter. The second raised frame structure can have the raised frame layer. The filter can be a band stop filter. The filter can have a plurality of the series BAW resonators that are coupled in series between a first port and a second port. The filter can have a plurality of the shunt BAW resonators that are coupled in parallel between the series BAW resonators and ground.

The raised frame layer can include a non-gradient portion with a substantially uniform thickness and a gradient portion with a tapered thickness. The non-gradient portion of the first raised frame layer can have a width that is larger than a combined thickness of the first electrode, the piezoelectric layer, and the second electrode. The non-gradient portion of the raised frame layer can be between about 1.5 and about 2.5 times larger than the combined thickness of the first electrode, the piezoelectric layer, and the second electrode. The raised frame layer can have a thickness between about 0.02 to about 0.4 times the combined thickness of the first electrode, the piezoelectric layer, and the second electrode. The first raised frame layer can have a thickness between about 0.06 to about 0.15 times the combined thickness of the first electrode, the piezoelectric layer, and the second electrode. The filter can include an active region where the first electrode overlaps the second electrode. The active region can have a middle area, and the raised frame structure can be positioned outside the middle area of the active region. The combined thickness of the first electrode, the piezoelectric layer, and the second electrode can be taken at the middle area of the active region.

The raised frame layer can be between the first electrode and the second electrode. The piezoelectric layer can be over the first electrode, the second electrode can be over the piezoelectric layer, and the raised frame layer can be between the second electrode and the piezoelectric layer. The piezoelectric layer can be over the first electrode, the second electrode can be over the piezoelectric layer, and the raised frame layer can be between the first electrode and the piezoelectric layer. The raised frame layer can have a lower acoustic impedance than the first electrode. The raised frame layer can have a lower acoustic impedance than the second electrode. The raised frame layer can have a lower acoustic impedance than the piezoelectric layer. The raised frame layer can include silicon dioxide.

A band pass filter can include one or more of the bulk acoustic wave devices disclosed herein. A band stop filter can include one or more of the bulk acoustic wave devices disclosed herein. A ladder filter can include one or more of the bulk acoustic wave devices disclosed herein. A lattice filter can include one or more of the bulk acoustic wave devices disclosed herein. A diplexer can include one or more of the bulk acoustic wave devices disclosed herein. A duplexer can include one or more of the bulk acoustic wave devices disclosed herein. A multiplexer can include one or more of the bulk acoustic wave devices disclosed herein. A switching multiplexer can include one or more of the bulk acoustic wave devices disclosed herein.

A radio frequency module can include an acoustic wave die including at least one filter, the at least one filter can include one or more of the bulk acoustic wave devices disclosed herein. The radio frequency module can include a radio frequency circuit element that can be coupled to the acoustic wave die. The acoustic wave die and the radio frequency circuit element can be enclosed within a common module package.

A wireless communication device can include an acoustic wave filter that can have one or more of the bulk acoustic wave devices disclosed herein, an antenna operatively coupled to the acoustic wave filter, a radio frequency amplifier operatively coupled to the acoustic wave filter and configured to amplify a radio frequency signal, and a transceiver in communication with the radio frequency amplifier. The wireless communication device can include a baseband processor in communication with the transceiver. The acoustic wave filter can be included in a radio frequency front end. The wireless communication device can be a user equipment.

A wireless communication device can include an acoustic wave die having at least one filter that includes one or more of the bulk acoustic wave devices disclosed herein, an antenna operatively coupled to an acoustic wave filter, a radio frequency amplifier operatively coupled to the acoustic wave filter and configured to amplify a radio frequency signal, and a transceiver in communication with the radio frequency amplifier. The wireless communication device can include a baseband processor in communication with the transceiver. The acoustic wave filter can be included in a radio frequency front end. The wireless communication device can be a user equipment.

BRIEF DESCRIPTION OF THE DRAWINGS

Embodiments of this disclosure will now be described, by way of non-limiting example, with reference to the accompanying drawings, like reference numerals can refer to similar features throughout.

FIG. 8 is a partial cross-sectional view of an example raised frame bulk acoustic wave device.

FIGS. 9 and 10 are graphs showing simulated results for the raised frame bulk acoustic wave device of FIG. 8.

FIG. 11 is a partial cross-sectional view of an example raised frame bulk acoustic wave device.

FIGS. 12 and 13 are graphs showing simulated results for the raised frame bulk acoustic wave device of FIG. 11.

FIG. 14 is a partial cross-sectional view of an example raised frame bulk acoustic wave device.

FIGS. 15 and 16 are graphs showing simulated results for the raised frame bulk acoustic wave device of FIG. 5.

FIG. 21 is a graph that shows results for simulated filter response for a ladder filter that uses the BAW device of FIG. 11.

FIG. 22 is a graph that shows results for simulated filter response for a ladder filter that uses the BAW device of FIG. 14.

DETAILED DESCRIPTION OF CERTAIN EMBODIMENTS

Figure 1:
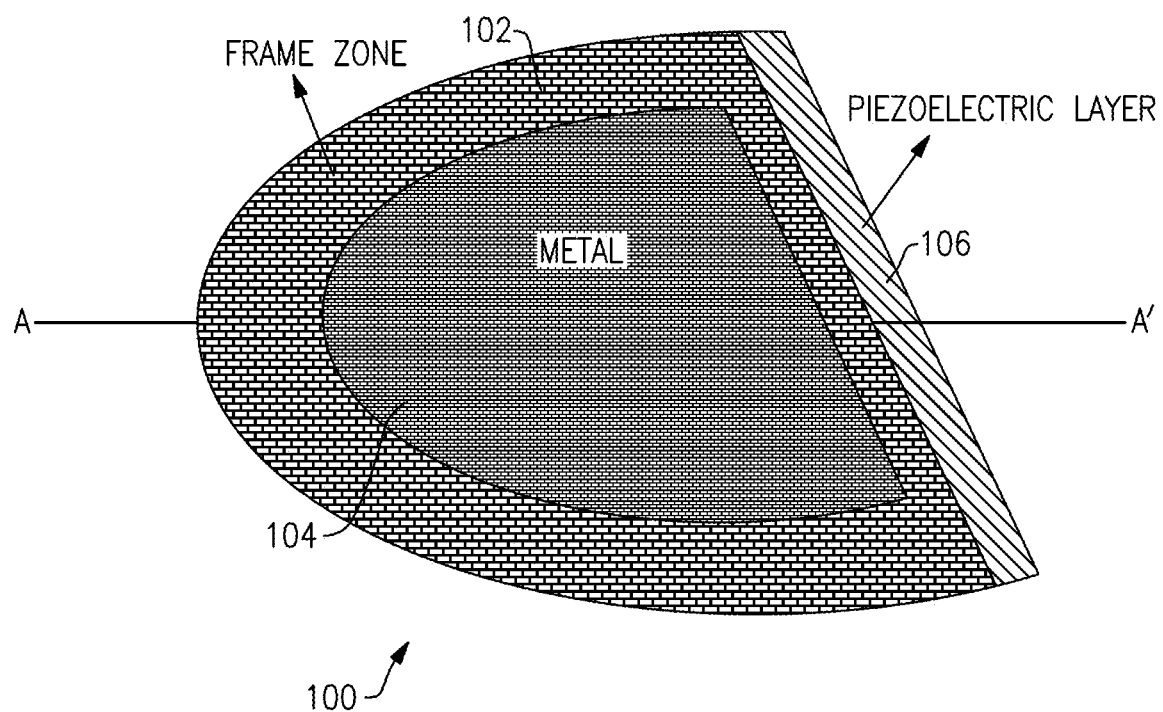
FIG. 1 is a plan view of an example embodiment of a raised frame bulk acoustic wave device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

For developing high performance bulk acoustic wave (BAW) filters, a high quality factor (Q) can be generally desirable. Bulk acoustic wave (BAW) devices can include raised frame structures. A raised frame structure can reduce lateral energy leakage from a main acoustically active region of the bulk acoustic wave device. For example, a BAW device can include a multi-layer raised frame structure, in some implementations. A BAW device can include a raised frame structure with a first layer that includes a material with a relatively low acoustic impedance (e.g., lower than one or both of the electrodes and/or the piezoelectric layer), such as silicon dioxide. The raised frame structure of the BAW device can include a second layer that includes a material with a relatively high acoustic impedance (e.g., higher than the first layer and/or the same or higher than one or both of the electrodes and/or the piezoelectric layer). A BAW device can include a single-layer raised frame structure, in some implementations. For example, the single-layer raised frame structure can include a layer with a relatively low acoustic impedance, or a layer with a relatively high acoustic impedance. The raised frame structure of the BAW device can facilitate achieving a relatively high Q, such as in a region above a resonant frequency and/or above an anti-resonant frequency. BAW devices with the raised frame structures disclosed herein can achieve low insertion loss and/or low Gamma loss, in some cases.

To achieve a high Q, a raised frame, which can be referred to as a border ring, can block lateral energy leakage from an active domain of a BAW resonator to a passive domain of the BAW resonator. A raised frame can improve Q, although it may not be able to trap all leakage energy. In some instances, the raised frame can generate a relatively large spurious mode, which can be referred to as a raised frame mode, which can be below a main resonant frequency of a BAW resonator. This can cause Gamma degradation in carrier aggregation bands for a filter. Gamma can refer to a reflection coefficient. The raised frame structure can be configured to suppress the spurious mode or raised frame mode, which can improve Q, such as below the resonant frequency, as discussed herein.

Some aspects of this disclosure relate to a bulk acoustic wave resonator that includes a raised frame structure that can achieve low insertion loss and/or low Gamma loss. The raised frame structure can be disposed outside or along a perimeter of an active region of the bulk acoustic wave resonator. The raised frame can include a material with relatively low acoustic impedance, which can be configured to provide low insertion loss and/or low Gamma loss. In some implementations, the multi-layer raised frame structure can include a first raised frame layer and a second raised frame layer. The first raised frame layer can include a relatively low acoustic impedance material, such as silicon dioxide, disposed between electrodes that are on opposing sides of a piezoelectric layer. For instance, the low acoustic impedance material can be disposed between a top electrode and a piezoelectric layer of a bulk acoustic wave resonator. The second raised frame layer can include a relatively high acoustic impedance material. The second raised frame layer can include a material this is heavier or more dense than the material of the first raised frame layer. In some cases, the second raised frame layer can be the same material as an electrode of the bulk acoustic wave resonator. The first raised frame layer (e.g., having a relatively low acoustic impedance) can extend further inward than the second raised frame layer (e.g., having a relatively high acoustic impedance). This raised frame configuration can suppress the spurious or raised frame mode without heavy degradation above the resonant frequency. The raised frame structures disclosed herein can provide improved Q below the resonant frequency, while maintaining a high Q above the resonant frequency.

In some implementations, a low Gamma loss can be achieved with a raised frame spurious mode away from carrier aggregation bands. Due to the low acoustic impedance material, the frequency of the raised frame domain generating a relatively strong raised frame spurious mode can be significantly lower than for other types of BAW devices. The low acoustic impedance material can be configured so that the raised frame mode for the raised frame structure can be outside of a carrier aggregation band so as not to provide a Gamma loss, or to provide low Gamma loss, in some cases. By way of example, in a carrier aggregation application, a multiplexer can include a common node arranged to receive a carrier aggregation signal, a first filter having a passband associated with a first carrier of the carrier aggregation signal, and a second filter coupled to the first filter at the common node and having a second passband associated with a second carrier of the carrier aggregation signal. The first filter can include a BAW resonator with a raised frame structure as disclosed herein, which can increase Gamma for the first filter in the passband of the second filter.

Also, some raised frame structures disclosed herein can have a low acoustic impedance material configured so that the difference between the effective acoustic impedance of the raised frame domain and the active domain can provide a high Q. In some embodiments, the raised frame structure can provide a high mode reflection of a lateral energy and can decrease mode conversion from main mode to other lateral modes around the anti-resonance frequency. Accordingly, the configuration of a low acoustic impedance layer or material in the raised frame structure can cause Q to be significantly increased, such as relative to other BAW devices or other raised frame structures.

Although some embodiments disclosed herein may be discussed with reference to dual raised frame structures with two raised frame layers, various suitable principles and advantages discussed herein can be applied to a single-layer raised frame structures or multi-layer raised frame structure that includes two or three or more raised frame layers.

FIG. 1 is a plan view of a raised frame bulk acoustic wave device 100. As shown in FIG. 1, the bulk acoustic wave device 100 can include a raised frame zone 102 around the perimeter of an active region of the bulk acoustic wave device 100. The raised frame zone 200 can be referred to as a border ring in certain instances. A raised frame structure can be in the raised frame zone 200. The raised frame structure can be implemented in accordance with any suitable principles and advantages of the raised frame bulk acoustic wave devices disclosed herein. The raised frame structure can be outside of a middle area 400 of the active region of the bulk acoustic wave device 100. A raised frame layer can be in the raised frame zone 200 and can extend above a metal electrode. FIG. 1 illustrates the metal electrode at the middle area 400 and the raised frame layer at the raised frame zone 200. One or more other layers can be included over the metal electrode and the raised frame layer. For instance, silicon dioxide can be included over the metal electrode and the raised frame layer. FIG. 1 also illustrates that a piezoelectric layer 600 of the bulk acoustic wave device 100 can be below the metal electrode and the raised frame layer.

Some embodiments of raised frame bulk acoustic wave devices will be discussed with reference to example cross sections along the line from A to A' in FIG. 1. Any suitable combination of features of the bulk acoustic wave devices disclosed herein can be combined with each other. Any of the bulk acoustic wave devices disclosed herein can be a bulk acoustic wave resonator in a filter, such as arranged to filter a radio frequency signal.

Figure 2:
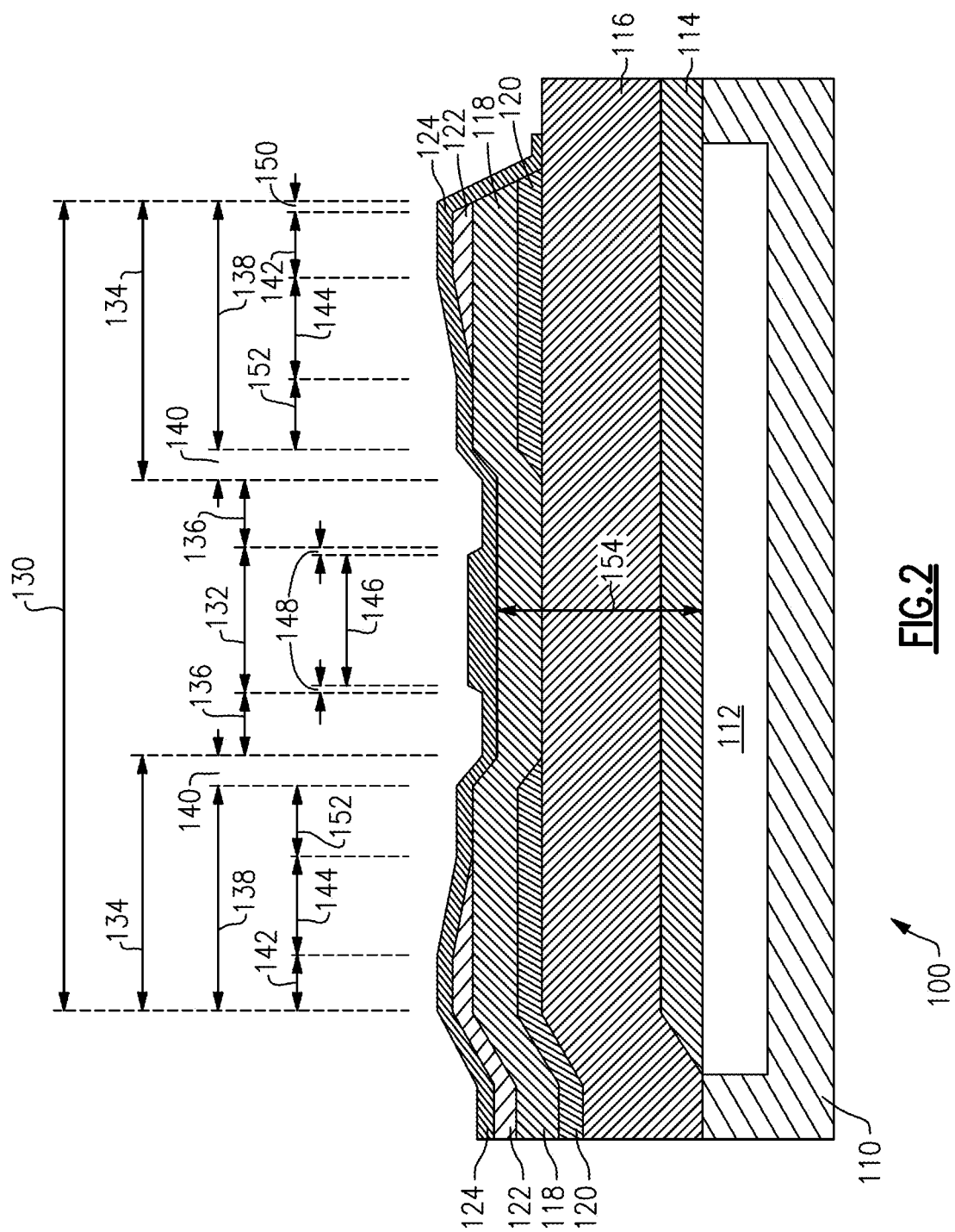
FIG. 2 is a cross-sectional view of an example embodiment of a raised frame bulk acoustic wave device.

FIG. 2 is a schematic cross-sectional view of an example of a bulk acoustic wave (BAW) device 100 with a dual-layer raised frame structure. The BAW device 100 can includes a support substrate 110, a cavity 112, a first or lower electrode 114 positioned over the support substrate 110, a piezoelectric layer 116 positioned over the lower electrode 114, a second or upper electrode 118 positioned over the piezoelectric layer 116, a first raised frame structure or layer 120 positioned at least partially between the piezoelectric layer 116 and the upper electrode 118, a second raised frame structure or layer 122 positioned over the upper electrode 118, and a passivation layer 124 positioned over the second raised frame structure 122.

The support substrate 110 can be a silicon substrate, and other suitable substrates can alternatively be implemented in place of the silicon substrate. One or more layers, such as a passivation layer, can be positioned between the lower electrode 114 and the support substrate 110. In some embodiments, the cavity 112 can be an air cavity.

The piezoelectric layer 116 can be disposed between the first electrode 114 and the second electrode 118. The piezoelectric layer 116 can be an aluminum nitride (AlN) layer or any other suitable piezoelectric layer. An active region 130 or active domain of the BAW device 100 can be defined by the portion of the piezoelectric layer 116 that overlaps with both the lower electrode 114 and the upper electrode 118, for example over an acoustic reflector, such as the cavity 112. The lower electrode 114 and/or the upper electrode 118 can have a relatively high acoustic impedance. For example, the lower electrode 114 and/or the upper electrode 118 can include molybdenum (Mo), tungsten (W), ruthenium (Ru), iridium (Ir), platinum (Pt), Ir/Pt, or any suitable alloy and/or combination thereof, although other suitable conductive materials could be used. The upper electrode 118 can be formed of the same material as the lower electrode 114 in certain instances, although different materials can be used for the lower electrode 114 and the upper electrode 118, in some cases.

The illustrated BAW device 100 can include an active region 130 that has a main acoustically active region 132 and a raised frame region 134 at least partially, or fully, surrounding the main acoustically active region 132 (e.g., in plan view). In the cross-sectional view of FIG. 2, the raised frame region 134 can be on opposing sides of the main acoustically active region 132. The main acoustically active region 132 may be referred to as a center region or middle area of the active region 130. The main acoustically active region 132 can set the main resonant frequency of the BAW device 100. There can be a significant (e.g., exponential) fall off of acoustic energy in the piezoelectric layer 116 for a main mode in the frame region 134 relative to the main acoustically active region 132. A recessed frame region 136 can be positioned between the main acoustically active region 132 and the raised frame region 134.

In some embodiments, the raised frame structure of the BAW device can be a dual-layer raised frame structure. The dual-layer raised frame structure of the BAW device 100 can include the first raised frame structure or layer 120 and the second raised frame structure or layer 122. The first raised frame layer 120 and the second raised frame layer 122 can at least partially overlap with each other in the active region 130 of the BAW device 100. A raised frame region 134 or domain of the BAW device 100 can be defined by the portion of the raised frame structure in the active region 130 of the BAW 100. At least a portion of the raised frame structure can be included in an active region 130 of the BAW device 100.

The first raised frame layer 120 can be positioned between the first or lower electrode 114 and the second or upper electrode 118. As illustrated in FIG. 2, the first raised frame layer 120 can be positioned between the piezoelectric layer 116 and the second electrode 118. The first raised frame layer 120 can extend beyond the active region of the bulk acoustic wave device 100 as shown in FIG. 2, which can be beneficial for manufacturability reasons in certain instances. The first raised frame layer 120 can have a non-gradient portion 138 and a gradient portion 140. The non-gradient portion of the first raised frame layer 120 (e.g., the upper surface thereof) can be substantially parallel to the piezoelectric layer 116 (e.g., to the upper surface thereof). The non-gradient portion 138 of the first raised frame layer 120 can have a substantially uniform thickness. The gradient portion 140 of the first raised frame layer 120 can be tapered, and can be at an end or edge of the first raised frame layer 120, for example. The upper surface of the gradient portion 140 of the first raised frame layer 120 can form a gradient angle relative to upper surface of the non-gradient portion 138 of the first raised frame layer 120. The gradient portion 140 of the first raised frame layer 120 can have a decreasing thickness moving along a direction from the raised frame structure toward the main acoustically active region 132 (or middle area). The gradient portion 140 can be inward of the non-gradient portion 138 of the first raised frame layer 120. The non-gradient portion 138 can at least partially, or completely, surround the gradient portion 140 (e.g., in plan view).

The first raised frame layer 120 can be a low acoustic impedance material. The low acoustic impedance material can have a lower acoustic impedance than the material of the first electrode 114. The low acoustic impedance material has a lower acoustic impedance than the material of the second electrode 118. The low acoustic impedance material can have a lower acoustic impedance than the material of the piezoelectric layer 116. As an example, the first raised frame layer 120 can be a silicon dioxide (SiO2) layer. Since silicon dioxide is already used in a variety of bulk acoustic wave devices, a silicon dioxide first raised frame layer 120 can be relatively easy to manufacture. Other oxide materials can be used, and the first raised frame structure or layer 120 can be an oxide raised frame structure or layer. The first raised frame layer 120 can be a silicon nitride (SiN) layer, a silicon carbide (SiC) layer, or any other suitable low acoustic impedance layer. The first raised frame layer 120 can have a relatively low density. The density and/or acoustic impedance of the first raised frame layer 120 can be lower than the density and/or acoustic impedance of the lower electrode 114, of the upper electrode 118, of the piezoelectric layer 116, and/or of the second raised frame layer 122 of the BAW device 100.

The second raised frame layer 122 can at least partially overlap the first raised frame layer 120, such as in the active region 130 of the BAW device 100. The second raised frame layer 122 can be positioned over the upper electrode 118. The upper electrode 118 can be positioned between the first raised frame layer 120 and the second raised frame layer 122. The second raised frame layer 122 can extend beyond the active region of the bulk acoustic wave device 100 as shown in FIG. 2, which can be beneficial for manufacturability reasons in certain instances. The second raised frame layer 122 can have a non-gradient portion 142 and a gradient portion 144. The non-gradient portion 142 of the second raised frame layer 122 (e.g., the upper surface thereof) can be substantially parallel to the piezoelectric layer 116 (e.g., to the upper surface thereof). The non-gradient portion 142 of the second raised frame layer 122 can have a substantially uniform thickness. The gradient portion 144 of the second raised frame layer 122 can be tapered, and can be at an end or edge of the second raised frame layer 122, for example. The upper surface of the gradient portion 144 of the second raised frame layer 122 can form an angle relative to upper surface of the non-gradient portion 142 of the second raised frame layer 122. The gradient portion 144 of the second raised frame layer 122 can have a decreasing thickness moving along a direction from the raised frame structure toward the main acoustically active region 132 (or middle area). The gradient portion 144 can be inward of the non-gradient portion 142 of the second raised frame layer 122. The non-gradient portion 142 can at least partially, or completely, surround the gradient portion 144 (e.g., in plan view).

The second raised frame layer 122 can be a relatively high acoustic impedance material. The second raised frame layer 122 can include a relatively high density material. For instance, the second raised frame layer 122 can include molybdenum (Mo), tungsten (W), ruthenium (Ru), platinum (Pt), iridium (Ir), the like, or any suitable alloy thereof. The second raised frame layer 122 can be a metal layer. Alternatively, the second raised frame layer 122 can be a suitable non-metal material with a relatively high density. The density and/or acoustic impedance of the second raised frame layer 122 can be similar to or greater than the density and/or acoustic impedance of the lower electrode 114, of the upper electrode 118, of the piezoelectric layer 116, and/or of the first raised frame layer 120 of the BAW device 100. In some instances, the raised frame structure 20 can be of the same material as the lower electrode 114 and/or the upper electrode 118 of the BAW device 100. In some implementations, the second raised frame layer 122 can be adjacent to the upper electrode 118. The upper electrode 118 can have a substantially uniform thickness, although in some cases it may be angled (e.g., downward or toward the piezoelectric layer 116). The second raised frame layer 122 can be a thickened region of the same material that makes up the upper electrode 118. The upper electrode 118 and the second raised frame layer 122 can be formed by different processing steps, and in some cases the can be a resulting identifiable transition between the upper electrode 118 and the second raised frame layer 122 of the same material, although some implementations may not have an identifiable transition between the upper electrode and the second raised frame layer 122.

The second raised frame layer 122 can increase the height of the BAW device 100 in the raised frame region 134. Accordingly, the BAW device 100 can have a greater height in the raised frame region 134 than in other portions of the active region 130, such as the middle area of the active domain. Forming the second raised frame layer 122 over the upper or second electrode 118 can be relatively easy from a manufacturing perspective. However, in some other embodiments, a second raised frame layer 122 can be included in a different position in the stack of layers in the raised frame domain.

The passivation layer 124 can be positioned over the upper electrode 118 and/or over the second raised frame layer 122. The passivation layer 124 can be a silicon dioxide layer, although any suitable passivation material can be used. The passivation layer 124 can be formed with different thicknesses in different regions of the BAW device 100. For example, as shown in FIG. 2, the passivation layer 124 can be thinner in the recessed frame region 136 than in the main acoustically active region 132, or than in other portions such as the raised frame region 134. In some cases, the recessed frame region 136 can contribute to achieving the relatively high Q, such as below the resonant frequency. By way of example, the combination of the recessed frame region 136 and the raised frame structure of the BAW device 100 can contribute to achieving the relatively high Q, such as below the resonant frequency. In some embodiments, the recessed frame region 136 can be omitted, such as by using a passivation layer 124 that has a substantially uniform thickness. Also, in some embodiments, the passivation layer 124 can be omitted.

The passivation layer 124 can have a non-gradient portion 146 and a gradient portion 148. The non-gradient portion 146 of the passivation layer 124 (e.g., the upper surface thereof) can be substantially parallel to the piezoelectric layer 116 (e.g., to the upper surface thereof). The non-gradient portion 146 of the passivation layer 124 can have a substantially uniform thickness. The gradient portion 148 of the passivation layer 124 can be tapered, for example, and the upper surface of the gradient portion 148 of the passivation layer 124 can form a gradient angle relative to upper surface of the non-gradient portion 146 of the passivation layer 124. The passivation layer 124 can have a decreasing thickness moving along a direction from the main acoustically active region 132 (or middle area) toward the raised frame structure. The non-gradient portion 146 can be inward of the gradient portion 148 of the passivation layer 124. The gradient portion 148 can at least partially, or completely, surround the non-gradient portion 146 (e.g., in plan view).

The first or lower electrode 114 can have a non-gradient portion and a gradient portion. The non-gradient portion of the electrode 114 (e.g., the upper surface thereof) can be substantially parallel to the piezoelectric layer 116 (e.g., to the upper surface thereof). The non-gradient portion of the electrode 114 can have a substantially uniform thickness. The gradient portion of the electrode 114 can be tapered, and can be at an end of the electrode 114, for example. The upper surface of the gradient portion of the electrode 114 can form a gradient angle relative to upper surface of the non-gradient portion of the electrode 114. The electrode 114 can have a decreasing thickness moving along a direction from the main acoustically active region 132 (or middle area) toward the raised frame structure.

The second or upper electrode 118 can have a non-gradient portion and a gradient portion. The non-gradient portion of the electrode 118 (e.g., the upper surface thereof) can be substantially parallel to the piezoelectric layer 116 (e.g., to the upper surface thereof). The non-gradient portion of the electrode 118 can have a substantially uniform thickness. The gradient portion of the electrode 118 can be tapered, and can be at an end of the electrode 118, for example. The upper surface of the gradient portion of the electrode 118 can form a gradient angle relative to upper surface of the non-gradient portion of the electrode 118. The electrode 118 can have a decreasing thickness moving along a direction from the main acoustically active region 132 (or middle area) toward the raised frame structure. The first or lower electrode 114 can have a gradient portion on a first side of the BAW device, and the second or upper electrode 118 can have a gradient portion on a second side of the BAW device, such as opposite the first side.

The active region 130 of the BAW device can be defined by the overlap between the non-gradient portions of the first electrode 114 and the second electrode 118 (e.g., and the piezoelectric layer 116 as well), as shown in FIG. 2. In some embodiments, the active region 130 of the BAW device can include some or all of the gradient portions of the electrodes 114, 118. In some embodiments, the first raised frame layer 120 and/or the second raised frame layer 122 can have outer gradient portion(s), as shown, for example on the right side of FIG. 2. In some embodiments, the outer gradient portion 150 of the second raised frame portion 122 can be positioned directly above a non-gradient portion of the electrode 118, which can be inside the active area 130 (e.g., when defined by the overlapping non-gradient portions of the electrodes 114, 118). The upper surface of the outer gradient portion(s) can form a gradient angle relative to upper surface of the corresponding non-gradient portion(s). The gradient portion (s) can have a decreasing thickness moving along a direction from the main acoustically active region 132 (or middle area) toward the raised frame structure.

The first raised frame layer 120 can extend inward further than the second raised frame layer 122. The width of the first raised frame layer 120 can be larger than the width of the second raised frame layer 122. The widths of the first raised frame layer 120 and the second raised frame layer 122 can be measured from the active boundary of the active region 130 (e.g., inwardly). For example, portions of the first raised frame layer 120 and/or the second raised frame layer 122 that are outside the active region 130 can be disregarded for determining the width(s) thereof (e.g., the horizontal lengths in the cross-sectional view of FIG. 2). In some embodiments, the widths and other sizes and dimensions can be normalized or otherwise compared to the combined thickness 154 of the first electrode 114, the piezoelectric layer 116, and the second electrode 118. The combined thickness 154 can be taken through the main acoustically active region 132 or middle area of the BAW device. In some embodiments, the primary resonant frequency of the BAW device can correspond to a resonant wavelength λ that can be double the combined thickness 154 of the piezoelectric layer 116 and the first and second electrodes 114, 118. Accordingly, in some cases, the dimensions of the BAW device 100 can be scaled in order to resonate different wavelengths and frequencies, and in some cases, the sizes and dimensions of the raised frame structure can scale with the rest of the BAW device 100.

In some embodiments, the width of the first raised frame layer 120 (e.g., the combined non-gradient portion 138 and gradient portion 140) can be wider than a combined thickness 154 of the piezoelectric layer 116 and the first and second electrodes 114, 118, such as about 1.1 times wider, about 1.25 times wider, about 1.5 times wider, about 1.75 times wider, about 2 times wider, about 2.1 time wider, about 2.2 times wider, about 2.3 times wider, about 2.4 times wider, about 2.5 times wider, about 2.6 times wider, about 2.7 times wider, about 2.8 times wider, about 2.9 times wider, about 3 times wider, about 3.25 times wider, about 3.5 times wider, about 3.75 times wider, about 4 times wider, about 4.5 times wider, about 5 times wider, or more, or any values therebetween, or any ranges between any of these values, although other configurations could be used. In some embodiments, the combined thickness 154 can be smaller than shown in FIG. 2, for example. The widths can be taken in the active region 130, such as where the first and second electrodes 114, 118 (e.g., the non-gradient portions thereof) overlap. In some embodiments, the non-gradient portion 138 of the first raised frame layer 120 can be wider than a combined thickness 154 of the piezoelectric layer 116 and the first and second electrodes 114, 118, such as about 1.1 times wider, about 1.25 times wider, about 1.5 times wider, about 1.75 times wider, about 1.9 times wider, about 2 times wider, about 2.1 times wider, about 2.2 times wider, about 2.3 times wider, about 2.5 times wider, about 2.75 times wider, about 3 times wider, about 3.5 times wider, about 4 times wider, 5 times wider, or more, or any values therebetween, or any ranges between any of these values, although other configurations could be used. In some embodiments, the combined thickness 154 can be smaller than shown in FIG. 2, for example.

In some embodiments, the non-gradient portion 138 of the first raised frame layer 120 can be wider than the non-gradient portion 142 of the second raised frame layer 122 by an amount that is larger than the combined thickness 154 of the piezoelectric layer 116 and the first and second electrodes 114, 118, or by an amount that is larger than a thickness of the first raised frame layer 120, or by an amount that is larger than a thickness of the second raised frame layer 122, or by an amount that is larger than a combined thickness of the first and second raised frame layers 120, 122, or by an amount that is larger than combined thickness of the first raised frame layer 120, the second electrode 118, and the second raised frame layer 122. The non-gradient portion 138 of the first raised frame layer 120 can be wider than the non-gradient portion 142 of the second raised frame layer 122, such as about 1.25 times wider, about 1.5 times wider, about 1.75 times wider, about 2 times wider, about 2.5 times wider, about 3 times wider, about 3.5 times wider, about 4 times wider, about 4.25 times wider, about 4.5 times wider, about 4.75 times wider, about 4.9 times wider, about 5 times wider, about 5.1 times wider, about 5.25 times wider, about 5.5 times wider, about 5.75 times wider, about 6 times wider, about 6.5 times wider, about 7 times wider, about 8 times wider, or more, or any values therebetween, or any ranges between any of these values, although other configurations could be used. The non-gradient portion 138 of the first raised frame layer 120 can be wider than the combined width of the non-gradient portion 142 and the gradient portion 144 of the second raised frame layer 122, such as about 1.05 times wider, about 1.1 times wider, about 1.15 times wider, about 1.2 times wider, about 1.25 times wider, about 1.3 times wider, about 1.35 times wider, about 1.4 times wider, about 1.45 times wider, about 1.5 times wider, about 1.6 times wider, about 1.75 times wider, about 2 times wider, about 2.5 times wider, about 3 times wider, or more, or any values therebetween, or any ranges between any of these values, although other configurations could be used.

The combined width of non-gradient portion 138 and the gradient portion 140 of the first raised frame layer 120 can be wider than the combined width of the non-gradient portion 142 and the gradient portion 144 of the second raised frame layer 122, such as about 1.05 times wider, about 1.1 times wider, about 1.2 times wider, about 1.25 times wider, about 1.3 times wider, about 1.35 times wider, about 1.4 times wider, about 1.45 times wider, about 1.5 times wider, about 1.55 times wider, about 1.6 times wider, about 1.7 times wider, about 1.8 times wider, about 2 times wider, about 2.5 times wider, about 3 times wider, about 4 times wider, or more, or any values therebetween, or any ranges between any of these values, although other configurations could be used.

The non-gradient portion 138 of the first raised frame layer 120 can extend inwardly past the non-gradient portion 142 of the second raised frame layer 122 by a distance (e.g., the combined distances 144 and 152 in FIG. 2) that is larger than the thickness of the first raised frame layer 120, or larger than the thickness of the second raised frame layer 122, or larger than a combined thickness of the first raised frame layer 120 and the second raised frame layer 122, or larger than a combined thickness of the first raised frame layer 120, the second electrode 118, and the second raised frame layer 122. In some embodiments, the non-gradient portion 138 of the first raised frame layer 120 can extend inwardly past the non-gradient portion 142 of the second raised frame layer 122 by a distance (e.g., the combined distances 144 and 152 in FIG. 2) that is larger than the combined thickness 154 of the piezoelectric layer 116 and the first and second electrodes 114, 118, such as about 1.05 times larger, about 1.1 times larger, about 1.25 times larger, about 1.4 times larger, about 1.45 times larger, about 1.5 times larger, about 1.55 times larger, about 1.6 times larger, about 1.65 times larger, about 1.7 times larger, about 1.75 times larger, about 1.8 times larger, about 1.85 times larger, about 1.9 times larger, about 2 times larger, about 2.25 times larger, about 2.5 times larger, or about 3 times larger, or more, or any values therebetween, or any ranges between any of these values, although other configurations could be used.

The non-gradient portion 138 of the first raised frame layer 120 can extend inwardly past the gradient portion 144 of the second raised frame layer 122 by a distance (e.g., the distance 152 in FIG. 2) that is larger than the thickness of the first raised frame layer 120, or larger than the thickness of the second raised frame layer 122, or larger than a combined thickness of the first raised frame layer 120 and the second raised frame layer 122, or larger than a combined thickness of the first raised frame layer 120, the second electrode 118, and the second raised frame layer 122. In some embodiments, the non-gradient portion 138 of the first raised frame layer 120 can extend inwardly past the gradient portion 144 of the second raised frame layer 122 by a distance (e.g., the distance 152 in FIG. 2) that is a percentage of the combined thickness 154 of the piezoelectric layer 116 and the first and second electrodes 114, 118, and the percentage can be about 10%, about 20%, about 25%, about 30%, about 35%, about 40%, about 45%, about 50%, about 55%, about 60%, about 70%, about 75%, about 80%, about 90%, about 100%, or more, or any ranges between any of these values, although other configurations could be used.

The gradient portion 140 of the first raised frame layer 120 can extend inwardly past the gradient portion 144 of the second raised frame layer 122 by a distance (e.g., the combined distances 140 and 152 in FIG. 2) that is larger than the thickness of the first raised frame layer 120, or larger than the thickness of the second raised frame layer 122, or larger than a combined thickness of the first raised frame layer 120 and the second raised frame layer 122, or larger than a combined thickness of the first raised frame layer 120, the second electrode 118, and the second raised frame layer 122. In some embodiments, the gradient portion 140 of the first raised frame layer 120 can extend inwardly past the gradient portion 144 of the second raised frame layer 122 by a distance (e.g., the combined distances 140 and 152 in FIG. 2) that is a percentage of the combined thickness 154 of the piezoelectric layer 116 and the first and second electrodes 114, 118, and the percentage can be about 10%, about 25%, about 50%, about 55%, about 60%, about 65%, about 70%, about 75%, about 80%, about 85%, about 90%, about 100%, about 125%, about 150%, or more, or any ranges between any of these values, although other configurations could be used.

The raised frame structure can have an outer non-gradient portion, which can be associated with the non-gradient portion 142 of the second raised frame layer 122, and which can have a substantially uniform overall thickness. The raised frame structure can have an outer gradient portion, which can be associated with the gradient portion 144 of the second raised frame layer 122, and which can have a tapered overall thickness. The raised frame structure can have an inner non-gradient portion 152, which can be associated with the non-gradient portion 138 of the first raised frame layer 120 that extends inward beyond the second raised frame layer 122, and which can have a substantially uniform overall thickness. The raised frame structure can have an inner gradient portion, which can be associated with the gradient portion 140 of the first raised frame layer 120, and which can have a tapered overall thickness. In some embodiments, the outer non-gradient portion (e.g., 142) can have a width that is substantially the same as the width of the inner non-gradient portion (e.g., 152). In some embodiments, the widths of the outer non-gradient portion (e.g., 142) and the inner non-gradient portion (e.g., 152) can vary by about 25% or less, by about 20%, by about 15% or less, by about 10% or less, by about 5% or less, or by about 0%.

In some cases, the first raised frame 120 designs disclosed herein can more effectively reduce an effective electromechanical coupling coefficient ($k^2$) of the raised frame domain or region 134 of the BAW device 100 relative to other BAW devices, such as the BAW device described in connection with FIG. 4. This can reduce excitation strength of a raised frame spurious mode. Moreover, the first raised frame layer 120 can be configured to contribute to move the frequency of the raised frame mode relatively far away from the main resonant frequency of the BAW device 100, which can result in little or no Gamma loss.

Figure 3:
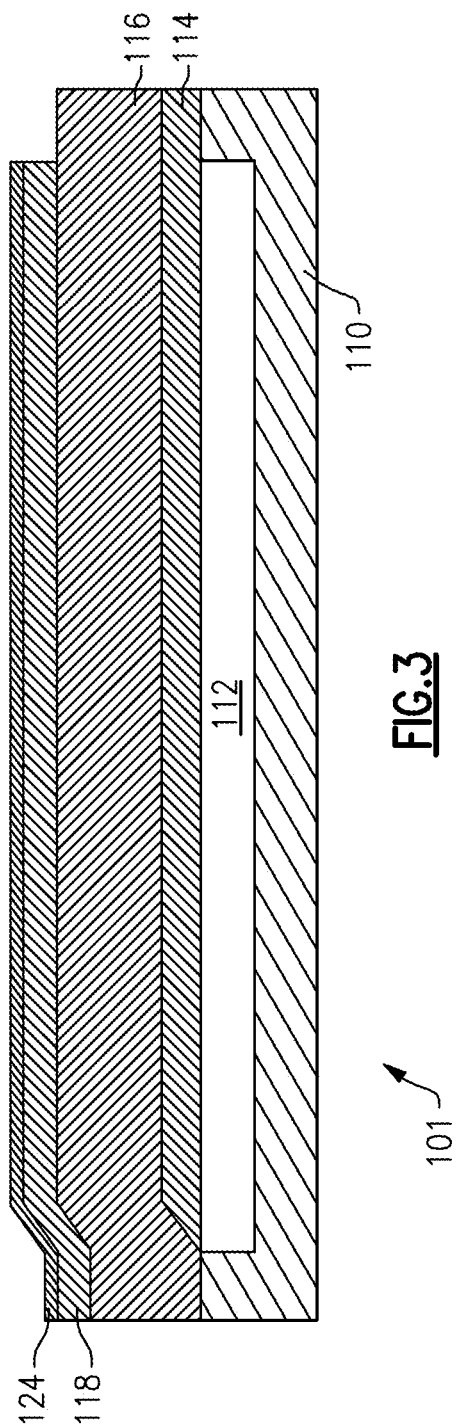
FIG. 3 is a cross-sectional view of an example raised frame bulk acoustic wave device.

FIG. 3 is a cross-sectional view of an example BAW device 101 that does not include a raised frame structure. The BAW device 101 of FIG. 3 can include a substrate 110, cavity 112, first or lower electrode 114, piezoelectric layer 116, second or upper electrode 118, and passivation layer 124, which can be similar to the corresponding components of the BAW device 100 of FIG. 2.

Figure 4:
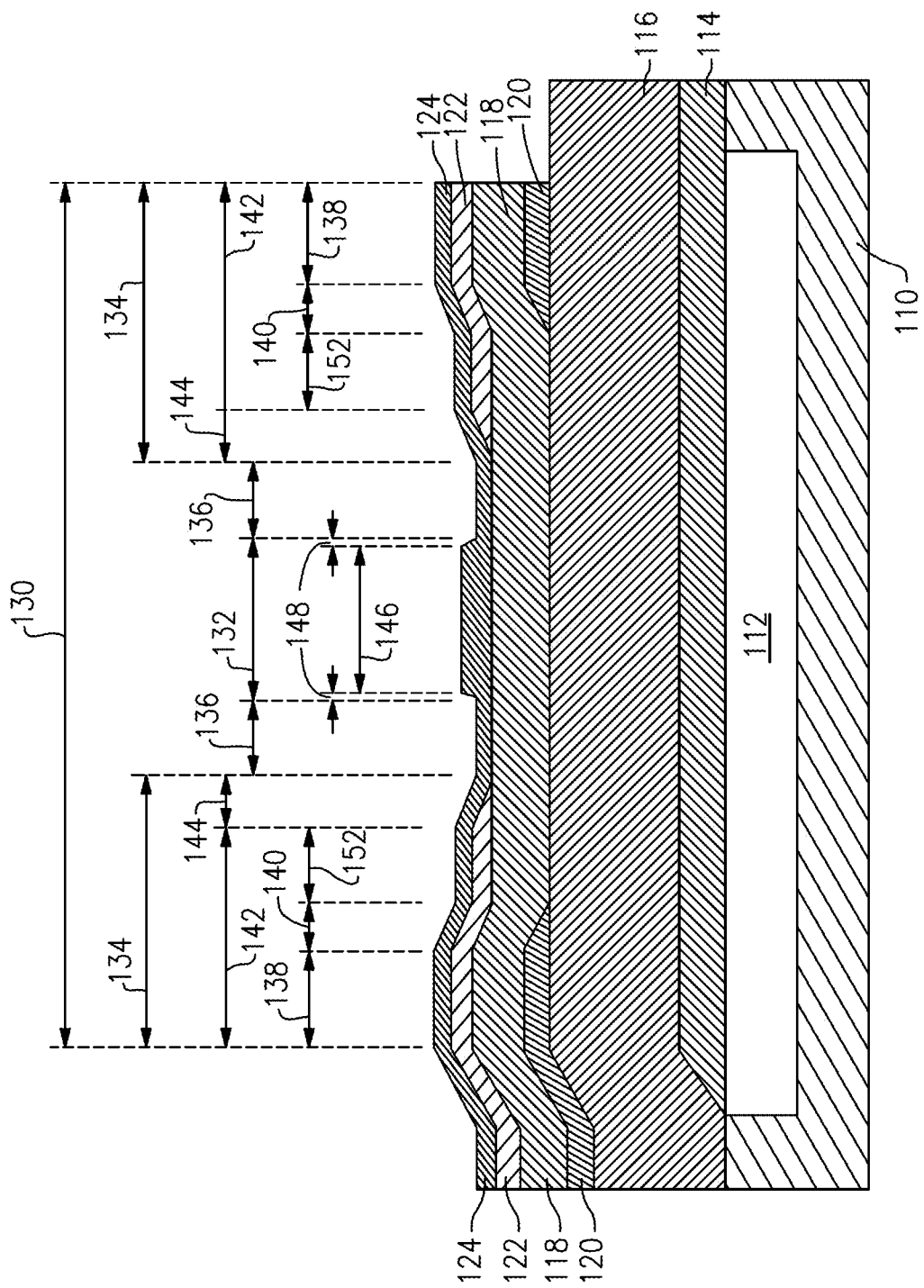
FIG. 4 is a cross-sectional view of another example raised frame bulk acoustic wave device.

FIG. 4 is a cross-sectional view of an example BAW device 103 that has a raised frame structure that is different from the embodiment illustrated in FIG. 2. The BAW device 103 of FIG. 4 can include a substrate 110, cavity 112, first or lower electrode 114, piezoelectric layer 116, second or upper electrode 118, and passivation layer 124, which can be similar to the corresponding components of the BAW device 100 of FIG. 2. The BAW device 103 can have a raised frame structure with a first raised frame structure 120 and a second raised frame structure 122, which can be similar to the corresponding components in the BAW device 100 of FIG. 2, except that the second raised frame 122 of the BAW device 103 can extend beyond the first raised frame 120 (e.g., inwardly).

Figure 5:
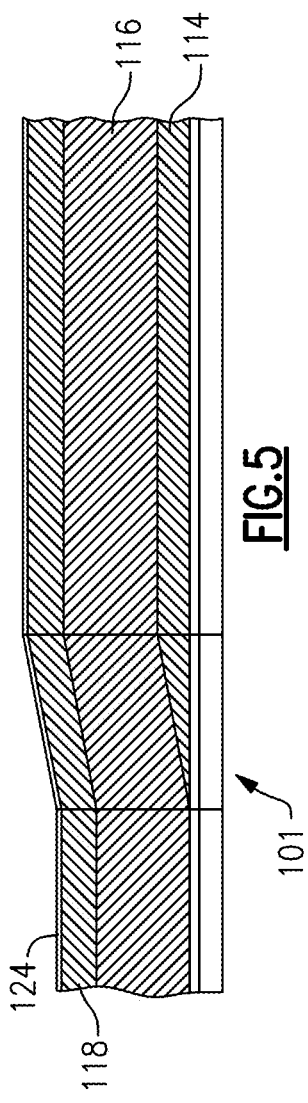
FIG. 5 is a partial cross-sectional view of an example raised frame bulk acoustic wave device.

FIG. 5 is a partial cross-sectional view of a BAW device 101, which can be similar to the BAW device 101 of FIG. 3. The example BAW device 101 has a lower electrode 114 with a thickness of 0.34 microns, a piezoelectric layer 116 with a thickness of 0.96 microns, and a second or upper electrode 118 with a thickness of 0.37 microns, with a combined thickness of 1.67 microns. The BAW device 101 can have a passivation layer 124. The BAW device 101 does not have a raised frame structure.

Figure 6:
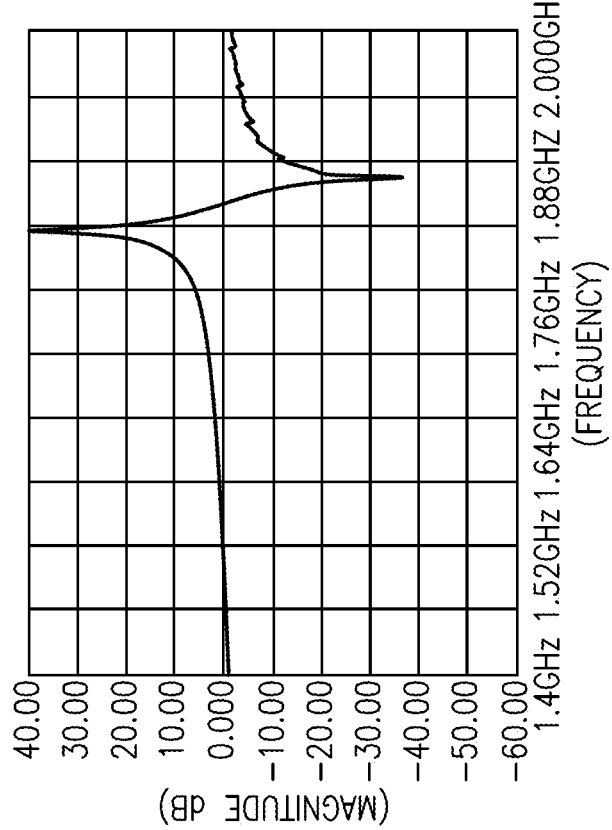

FIG. 6 is a graph that shows results for simulated admittance for the BAW device 101 of FIG. 5. FIG. 6 shows that the BAW device 101 has a resonant frequency of 1.813 GHz and an anti-resonant frequency at 1.863 GHz.

Figure 7:
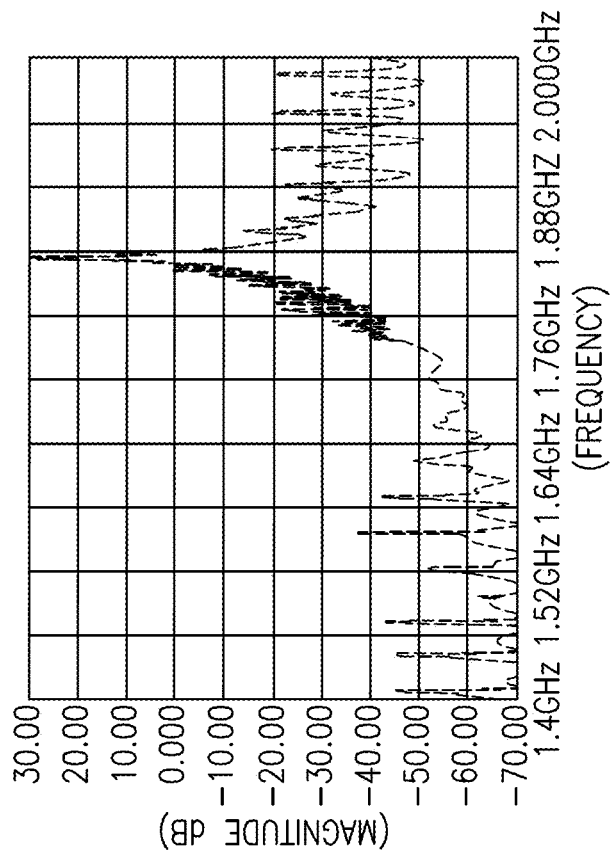
FIGS. 6 and 7 are graphs showing simulated results for the raised frame bulk acoustic wave device of FIG. 5.

FIG. 7 is a graph that shows results for simulated conductance for the BAW device 101 of FIG. 5. FIG. 7 that the BAW device 101 has good performance below the resonant frequency, but significant degradation above the resonant frequency.

FIG. 8 is a partial cross-sectional view of an example BAW device 103, which can be similar to the BAW device 103 of FIG. 4. The example BAW device 103 has a lower electrode 114 with a thickness of 0.34 microns, a piezoelectric layer 116 with a thickness of 0.96 microns, and a second or upper electrode 118 with a thickness of 0.37 microns, with a combined thickness of 1.67 microns. The BAW device 103 can have a passivation layer 124. The BAW device 103 has a raised frame structure with a first raised frame layer 120 and a second raised frame layer 122. The first raised frame layer 120 has a non-gradient portion 138 with a width of 1.4 microns and a gradient portion 140 with a width of about 0.4 microns. The first raised frame layer 120 can have a thickness of 0.14 microns (at the non-gradient portion 138). The second raised frame layer 122 has a non-gradient portion 142 with a width of about 2.5 microns and a gradient portion 144 with a width of about 1.6 microns. The second raised frame layer 122 can have a thickness of 0.18 microns (at the non-gradient portion 142). The non-gradient portion 142 of the second raised frame layer 122 can extend inwardly past the first raised frame layer 120 by a distance 152, which can be 0.7 microns.

FIG. 9 is a graph that shows results for simulated admittance for the BAW device 103 of FIG. 8. FIG. 9 shows that the BAW device 103 has a resonant frequency of 1.813 GHz and an anti-resonant frequency at 1.863 GHz.

FIG. 10 is a graph that shows results for simulated conductance for the BAW device 103 of FIG. 8. FIG. 10 shows that the BAW device 103 has improved performance above the resonant frequency, but significant degradation below the resonant frequency, as compared to the BAW device 101 with no raised frame structure. For example, the raised frame structure can produce a relatively large spurious mode 156, which can be referred to as a raised frame mode. The spurious mode 156 can be a thickness extension mode.

FIG. 11 is a partial cross-sectional view of an example BAW device 100, which can be similar to the BAW device 100 of FIG. 2. The example BAW device 100 has a lower electrode 114 with a thickness of 0.34 microns, a piezoelectric layer 116 with a thickness of 0.96 microns, and a second or upper electrode 118 with a thickness of 0.37 microns, with a combined thickness of 1.67 microns. The BAW device 100 can have a passivation layer 124. The BAW device 100 has a raised frame structure with a first raised frame layer 120 and a second raised frame layer 122. The first raised frame layer 120 has a non-gradient portion 138 with a width of 3.5 microns and a gradient portion 140 with a width of about 0.5 microns. The first raised frame layer 120 can have a thickness of 0.18 microns (at the non-gradient portion 138). The second raised frame layer 122 has a non-gradient portion 142 with a width of about 0.7 microns and a gradient portion 144 with a width of about 2.1 microns. The second raised frame layer 122 can have a thickness of 0.18 microns (at the non-gradient portion 142). The non-gradient portion 138 of the first raised frame layer 120 can extend inwardly past the second raised frame layer 122 by a distance 152, which can be 0.7 microns.

FIG. 12 is a graph that shows results for simulated admittance for the BAW device 100 of FIG. 11. FIG. 12 shows that the BAW device 100 has a resonant frequency of 1.813 GHz and an anti-resonant frequency at 1.863 GHz.

FIG. 13 is a graph that shows results for simulated conductance for the BAW device 100 of FIG. 11. FIG. 13 shows that the BAW device 100 has improved performance above the resonant frequency, as compared to the BAW device 101 with no raised frame structure, and that also has improved performance below the resonant frequency as compared to the BAW device 103 of FIG. 8. For example, the spurious mode 156, in FIG. 10 can be significantly reduced in FIG. 13.

In some embodiments, the second raised frame 122 can be omitted. FIG. 14 is a partial cross-sectional view of an example BAW device 105, which can be similar to the BAW device 100 of FIG. 4, except that the second raised frame layer 122 is omitted. The example BAW device 105 has a lower electrode 114 with a thickness of 0.34 microns, a piezoelectric layer 116 with a thickness of 0.96 microns, and a second or upper electrode 118 with a thickness of 0.37 microns, with a combined thickness of 1.67 microns. The BAW device 100 can have a passivation layer 124. The BAW device 100 has a raised frame structure with a raised frame layer 120. The raised frame layer 120 has a non-gradient portion 138 with a width of 1.5 microns and a gradient portion 140 with a width of about 0.4 microns. The raised frame layer 120 can have a thickness of 0.14 microns (at the non-gradient portion 138).

FIG. 15 is a graph that shows results for simulated admittance for the BAW device 105 of FIG. 14. FIG. 15 shows that the BAW device 105 has a resonant frequency of 1.813 GHz and an anti-resonant frequency at 1.863 GHz.

FIG. 16 is a graph that shows results for simulated conductance for the BAW device 105 of FIG. 14. FIG. 16 shows that the BAW device 105 has improved performance above the resonant frequency, as compared to the BAW device 101 with no raised frame structure, and that also has improved performance below the resonant frequency as compared to the BAW device 103 of FIG. 8. For example, the spurious mode 156, in FIG. 10 can be significantly reduced in FIG. 16. The performance below the resonant frequency can be better for the BAW device 100 of FIG. 11 than for the BAW device 105 of FIG. 14.

Figure 17:
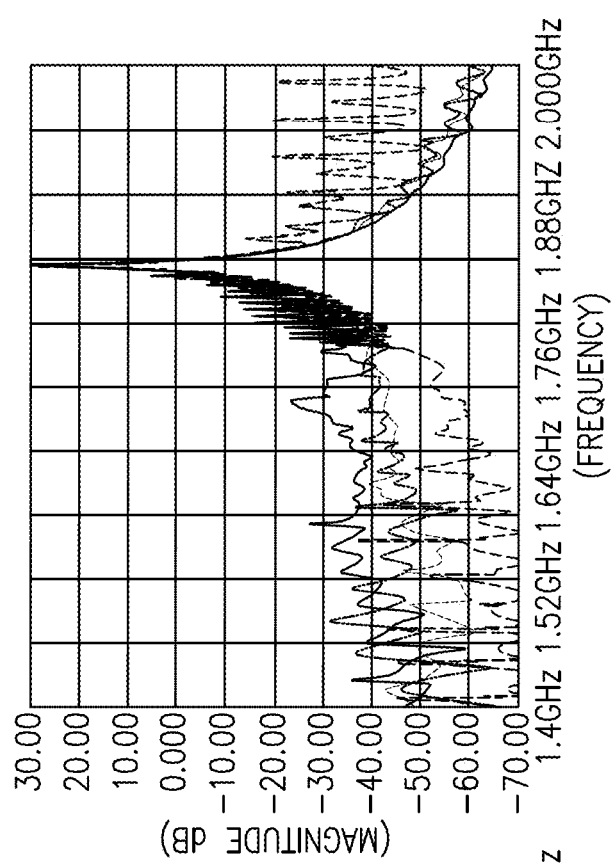
FIG. 17 is a graph that combines the results of FIGS. 6, 9, 12, and 15.

FIG. 17 is a graph that shows the results from FIGS. 6, 9, 12, and 15 combined into a single graph, for ease of comparison.

Figure 18:
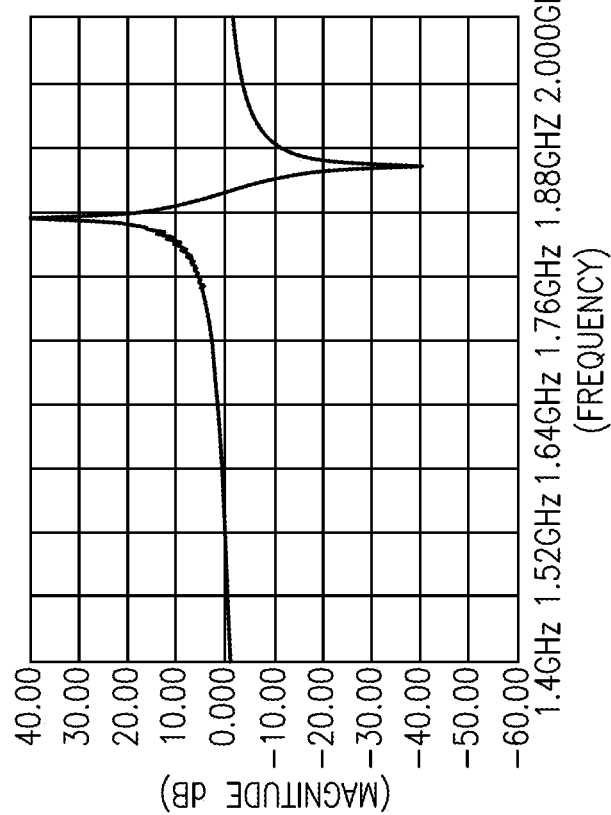
FIG. 18 is a graph that combines the results of FIGS. 7, 10, 13, and 16.

FIG. 18 is a graph that shows the results from FIGS. 7, 10, 13, and 16 combined into a single graph, for ease of comparison.

Figure 19:
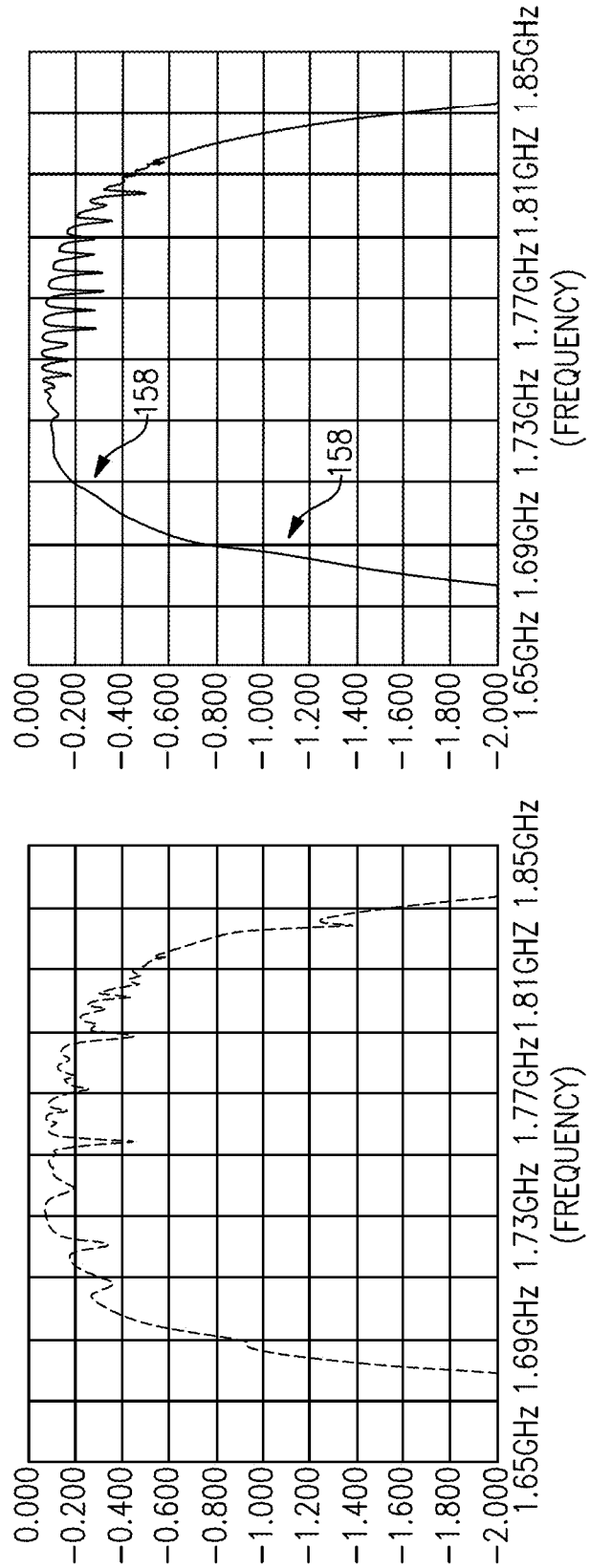
FIG. 19 is a graph that shows results for simulated filter response for a ladder filter that uses the BAW device of FIG. 5.
Figure 20:
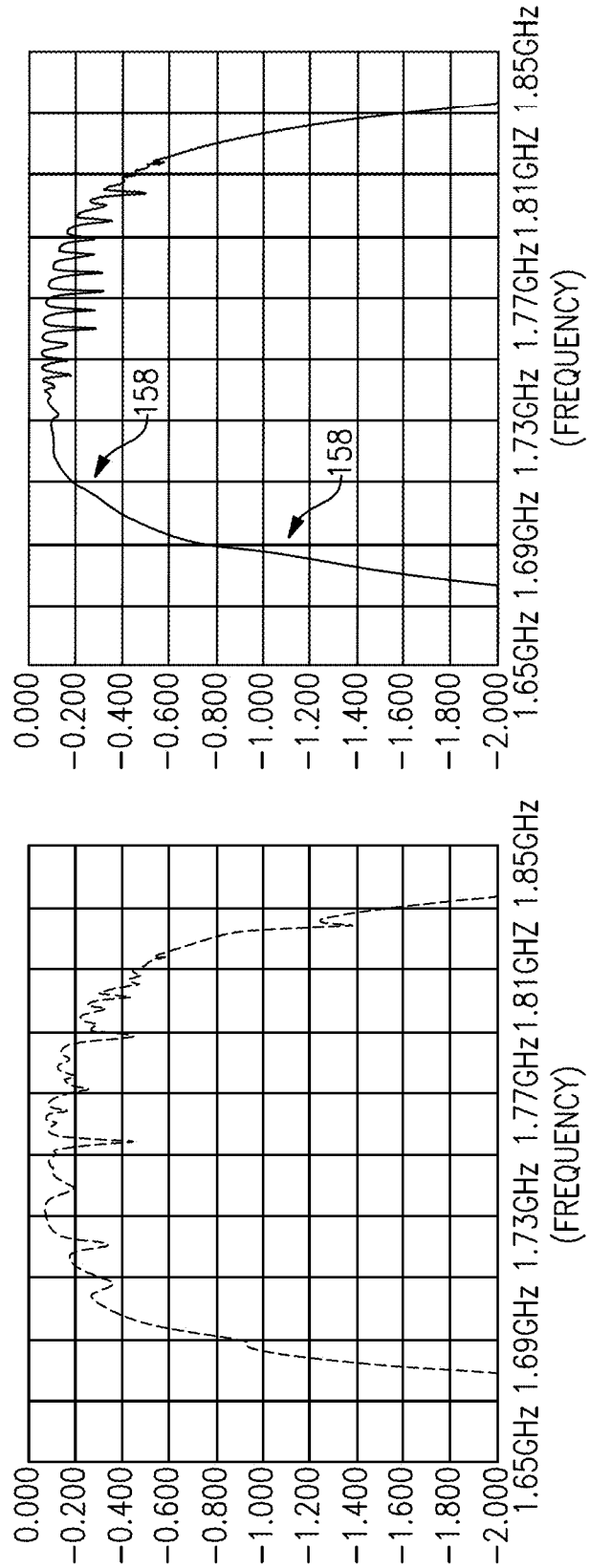
FIG. 20 is a graph that shows results for simulated filter response for a ladder filter that uses the BAW device of FIG. 8.
Figure 24:
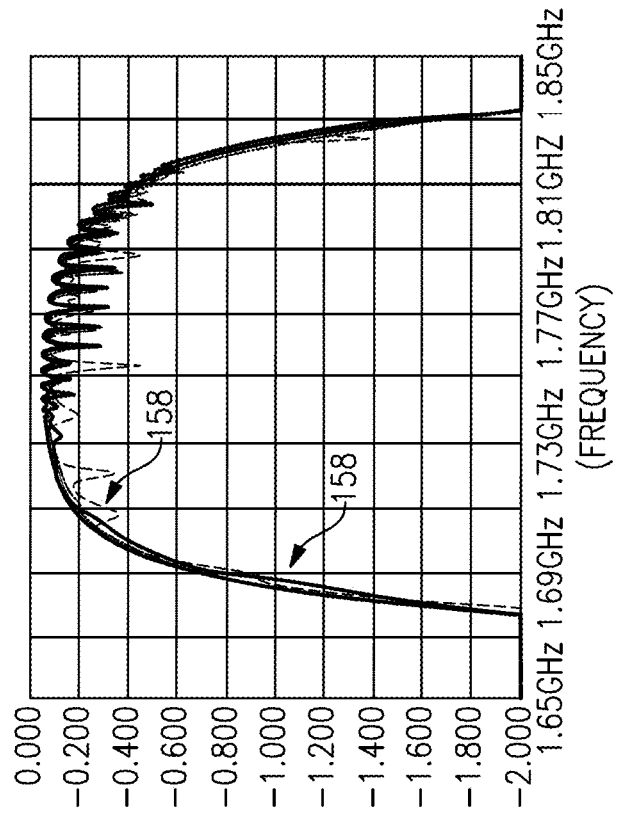
FIG. 24 is a graph that combines the results of FIGS. 19 to 23.
Figure 23:
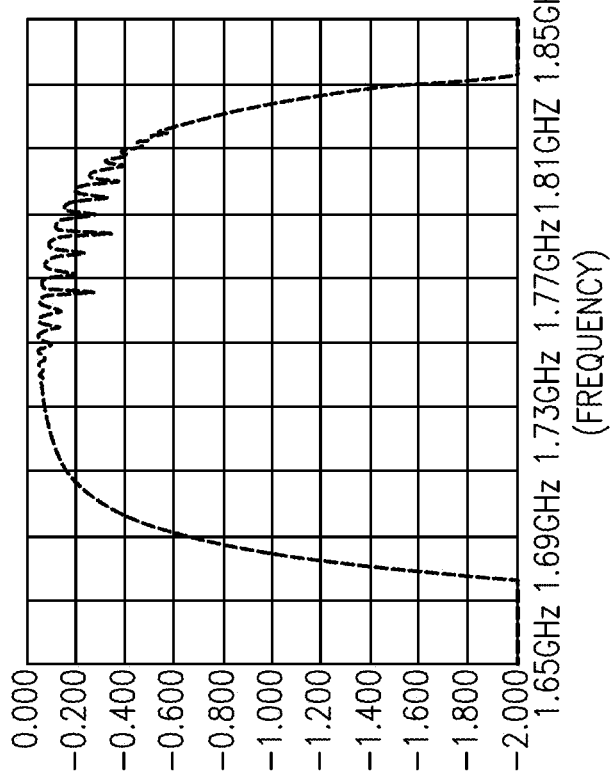
FIG. 23 is a graph that shows results for simulated filter response for a ladder filter that uses the BAW devices of FIGS. 8 and 11.

FIG. 19 is a graph that shows results for simulated filter response for a ladder filter that uses the BAW device 101 of FIG. 5, such as with no raised frame structure. FIG. 20 is a graph that shows results for simulated filter response for a ladder filter that uses the BAW device 103 of FIG. 8, such as with a raised frame structure where the second raised frame layer 122 extends further inward than the first raised frame layer 120. The filter response of FIG. 20 can have improved performance, as compared to the filter response of FIG. 19, but the filter response of FIG. 20 shows degradation at locations 158, which can be from thickness extension leakage from the spurious mode, which can be produced by the raised frame structure of FIG. 8. FIG. 21 is a graph that shows results for simulated filter response for a ladder filter that uses the BAW device 100 of FIG. 11, such as with a raised frame structure where the first raised frame layer 120 extends further inward than the second raised frame layer 122. The degradation discussed in connection with FIG. 20 can be reduced or eliminated in the filter response of FIG. 21, indicating that the raised frame structure of FIG. 11 can provide better filter performance, such as by suppressing the spurious mode. FIG. 22 is a graph that shows results for simulated filter response for a ladder filter that uses the BAW device 100 of FIG. 14, such as with a raised frame structure having a raised frame layer 120, and wherein the raised frame layer 122 is omitted. The degradation discussed in connection with FIG. 20 can be reduced or eliminated in the filter response of FIG. 22, indicating that the raised frame structure of FIG. 14 can provide better filter performance, such as by suppressing the spurious mode. FIG. 23 is a graph that shows results for simulated filter response for a ladder filter that uses parallel resonators with the BAW device 100 of FIG. 11, such as with a raised frame structure where the first raised frame layer 120 extends further inward than the second raised frame layer 122, and series resonators with the BAW device 103 of FIG. 8. The degradation discussed in connection with FIG. 20 can be reduced or eliminated in the filter response of FIG. 23, indicating that the raised frame structure of FIGS. 8 and 11 (or FIGS. 2 and 4) can be combined to provide better improved filter performance, such as by suppressing the spurious mode. FIG. 24 is a graph that shows the results from FIG. 19-23 combined into a single graph, for ease of comparison.

Figure 25:
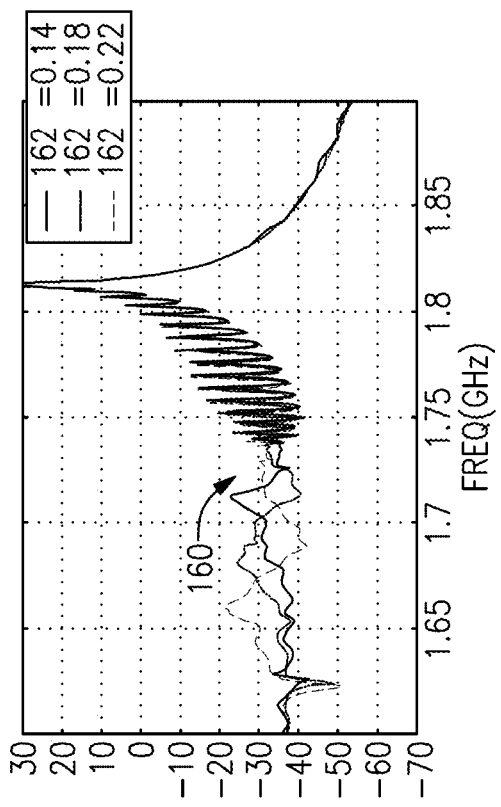
FIG. 25 is a graph that shows simulated results for BAW devices with varying width of the first raised frame layer.

FIG. 25 is a graph that shows results for simulated conductance for the BAW device 103 of FIG. 8, but for multiple widths for the non-gradient portion 138 of the first raised frame layer 120. FIG. 25 shows that as the width of the non-gradient portion 138 of the first raised frame layer 120 is reduced (e.g., from 1.8 microns to 1.4 microns) in the BAW device 103, the spurious mode can shift to a higher frequency (e.g., from about 1.68 GHz to about 1.7 GHz). FIG. 25 also shows that increasing the width of the non-gradient portion 138 of the first raised frame layer 120 (e.g., from 1.8 microns to 2.2 microns) can cause the spurious mode to shift to a lower frequency (e.g., from about 1.68 GHz to about 1.67 GHz). In some cases, shifting the spurious mode to a lower frequency can result in a next period spurious mode 160 at a higher frequency than the spurious mode that was shifted to a lower frequency. In some cases increasing the width of the first raised frame layer 120 and/or reducing the width of the second raised frame layer 122 (e.g., so that the first raised frame layer 120 extends further inward than the second raised frame layer 122), as shown in FIG. 11 can result in better performance (e.g., as shown in FIG. 13), as compared to merely adjusting the width of the first raised frame layer 120 (e.g., as shown in FIG. 25).

Figure 26:
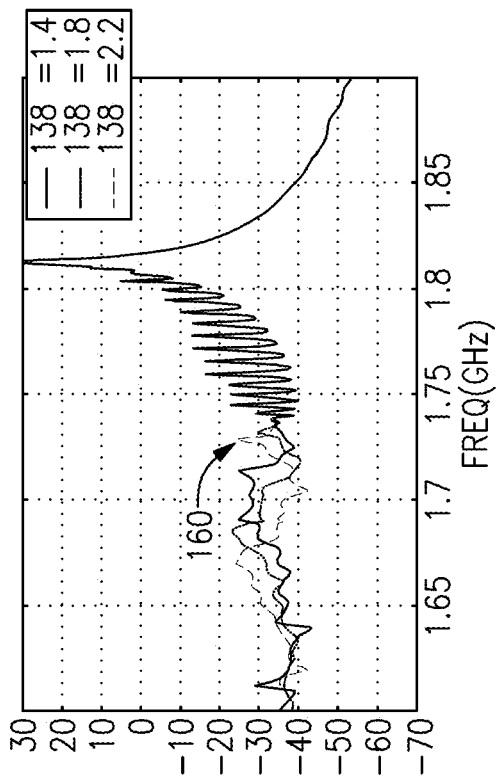
FIG. 26 is a graph that shows simulated results for BAW devices with varying thickness for the second raised frame layer.

FIG. 26 is a graph that shows results for simulated conductance for the BAW device 103 of FIG. 8, but for multiple thicknesses 162 for the non-gradient portion 142 of the second raised frame layer 122. FIG. 26 shows that as the thickness 162 of the second raised frame layer 122 is reduced (e.g., from 0.14 microns to 0.1 microns) in the BAW device 103, the spurious mode can shift to a higher frequency (e.g., from about 1.68 GHz to about 1.72 GHz). FIG. 26 also shows that increasing the thickness of the second raised frame layer 122 (e.g., from 0.18 microns to 0.22 microns) can cause the spurious mode to shift to a lower frequency (e.g., from about 1.68 GHz to about 1.66 GHz). In some cases, shifting the spurious mode to a lower frequency can result in a next period spurious mode 160 at a higher frequency than the spurious mode that was shifted to a lower frequency. In some cases increasing the width of the first raised frame layer 120 and/or reducing the width of the second raised frame layer 122 (e.g., so that the first raised frame layer 120 extends further inward than the second raised frame layer 122), as shown in FIG. 11 can result in better performance (e.g., as shown in FIG. 13), as compared to merely adjusting the thickness of the second raised frame layer 122 (e.g., as shown in FIG. 26).

Figure 27:
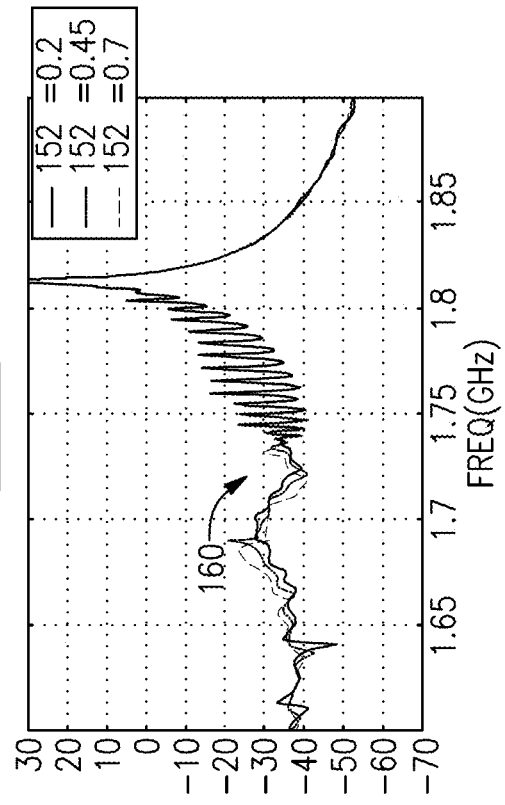
FIG. 27 is a graph that shows simulated results for BAW devices with varying thickness for the first raised frame layer.

FIG. 27 is a graph that shows results for simulated conductance for the BAW device 103 of FIG. 8, but for multiple thicknesses 164 for the non-gradient portion 138 of the first raised frame layer 120. FIG. 27 shows that as the thickness 164 of the first raised frame layer 120 is reduced (e.g., from 0.14 microns to 0.1 microns) in the BAW device 103, the spurious mode can shift to a higher frequency (e.g., from about 1.68 GHz to about 1.72 GHz). FIG. 27 also shows that increasing the thickness 164 of the non-gradient portion 138 of the first raised frame layer 120 (e.g., from 0.14 microns to 0.18 microns) can cause the spurious mode to shift to a lower frequency (e.g., from about 1.68 GHz to about 1.63 GHz), and/or can partially suppress the spurious mode, although in FIG. 27 the spurious mode is still above −35 dB. In some cases, increasing the width of the first raised frame layer 120 and/or reducing the width of the second raised frame layer 122 (e.g., so that the first raised frame layer 120 extends further inward than the second raised frame layer 122), as shown in FIG. 11 can result in better performance (e.g., as shown in FIG. 13), as compared to merely adjusting the thickness of the first raised frame layer 120 (e.g., as shown in FIG. 27).

Figure 28:
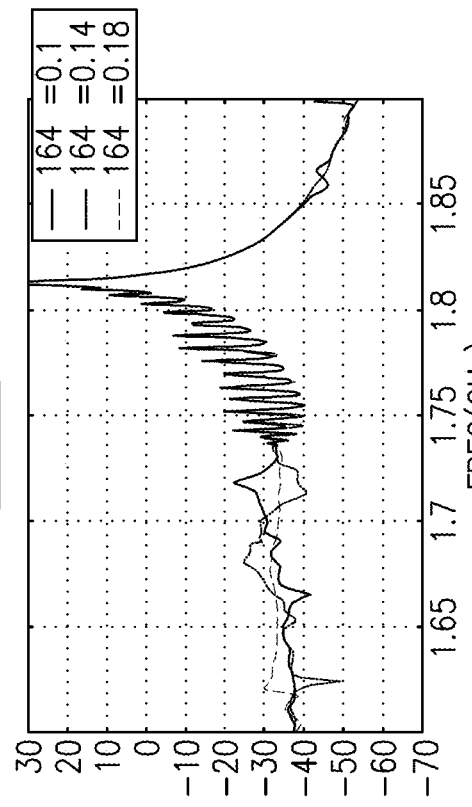
FIG. 28 is a graph that shows simulated results for BAW devices with varying width for the second raised frame layer.

FIG. 28 is a graph that shows results for simulated conductance for the BAW device 103 of FIG. 8, but for multiple widths for the non-gradient portion 142 of the second raised frame layer 122. FIG. 28 shows that as the width of the second raised frame layer 122 is reduced (e.g., with portion 152 reducing from 0.45 microns to 0.2 microns) in the BAW device 103, the spurious mode can shift to a higher frequency (e.g., from about 1.685 GHz to about 1.7 GHz). FIG. 28 also shows that increasing the width of the second raised frame layer 122 (e.g., with the portion 152 increasing from 0.45 microns to 0.7 microns) can cause the spurious mode to shift to a lower frequency (e.g., from about 1.685 GHz to about 1.68 GHz). In some cases, shifting the spurious mode to a lower frequency can result in a next period spurious mode 160 at a higher frequency than the spurious mode that was shifted to a lower frequency. In some cases increasing the width of the first raised frame layer 120 and/or reducing the width of the second raised frame layer 122 (e.g., so that the first raised frame layer 120 extends further inward than the second raised frame layer 122), as shown in FIG. 11 can result in better performance (e.g., as shown in FIG. 13), as compared to merely adjusting the width of the second raised frame layer 122 (e.g., as shown in FIG. 28).

Figure 29:
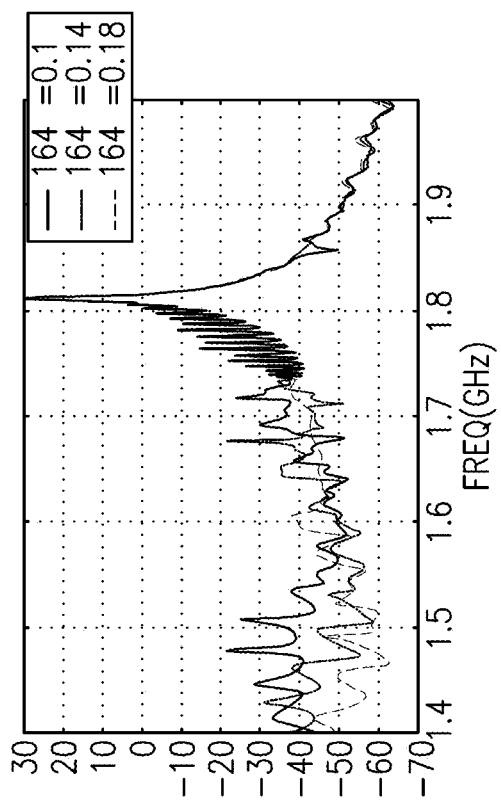
FIG. 29 is a graph that shows simulated results for BAW devices with varying thickness for the first raised frame layer.

FIG. 29 is a graph that shows results for simulated conductance for the BAW device 100 of FIG. 11, but for multiple thicknesses 164 for the non-gradient portion 138 of the first raised frame layer 120. FIG. 29 shows that as the thickness 164 of the first raised frame layer 120 increases (e.g., from 0.1 microns to 0.14 microns to 0.18 microns) in the BAW device 100, the spurious mode can be suppressed.

Figure 30:
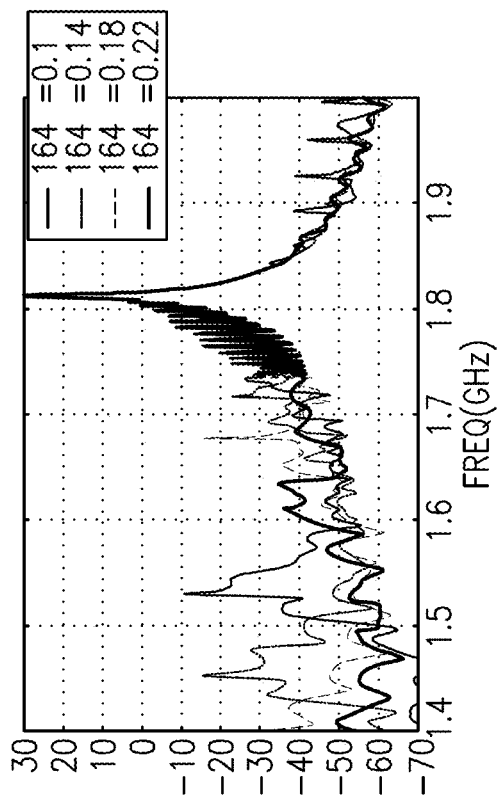
FIG. 30 is a graph that shows simulated results for BAW devices with varying thickness for the first raised frame layer, where the second raised frame layer is omitted.

FIG. 30 is a graph that shows results for simulated conductance for the BAW device 105 of FIG. 14, but for multiple thicknesses 164 for the non-gradient portion 138 of the first raised frame layer 120. FIG. 30 shows that as the thickness 164 of the first raised frame layer 120 increases (e.g., from 0.1 microns to 0.14 microns to 0.18 microns to 0.22 microns) in the BAW device 105, the performance can be improved. For a thickness 164 of 0.1 microns, the BAW can have significant degradation, such as above the resonant frequency. Accordingly, FIG. 30 shows that for BAW devices with a relatively thin low acoustic impedance layer (e.g., layer 120), the inclusion of a relatively high acoustic impedance layer (e.g., layer 122) can significantly improve the response of the BAW device. For BAW devices with a relatively thick acoustic impedance layer (e.g., layer 120), the BAW device can have good performance parameters, even without the second raised frame layer 122.

In some embodiments, the first raised frame layer 120 can have a thickness 164 of about 0.02 times, about 0.04 times, about 0.05 times, about 0.06 times, about 0.07 times, about 0.08 times, about 0.09 times, about 0.1 times, about 0.11 times, about 0.12 times, about 0.13 times, about 0.14 times, about 0.15 times, about 0.16 times, about 0.18 times, about 0.2 times, about 0.25 times, or about 0.3 times, or about 0.4 times the combined thickness 154 of the first electrode 114, the piezoelectric layer 116, and the second electrode 118, or any values therebetween, or any ranges bounded by any of these values. By way of select examples, the thickness 164 of the first raised frame layer 120 can be between about 0.04 times and about 0.2 times the combined thickness 154, or between about 0.06 times and about 0.15 times the combined thickness 154, or between about 0.075 times and about 0.125 times the combined thickness 154, although various designs can be used. The thickness of the first raised frame layer 120 can be taken at the non-gradient portion 138. In some embodiments, the second raised frame layer 122 can be omitted, and in other embodiments, the second raised frame layer 122 can be included.

In some embodiments, the second raised frame layer 122 can have a thickness 162 of about 0.02 times, about 0.04 times, about 0.05 times, about 0.06 times, about 0.07 times, about 0.08 times, about 0.09 times, about 0.1 times, about 0.11 times, about 0.12 times, about 0.13 times, about 0.14 times, about 0.15 times, about 0.16 times, about 0.18 times, about 0.2 times, about 0.25 times, or about 0.3 times, or about 0.4 times the combined thickness 154 of the first electrode 114, the piezoelectric layer 116, and the second electrode 118, or any values therebetween, or any ranges bounded by any of these values. By way of select examples, the thickness 162 of the second raised frame layer 122 can be between about 0.04 times and about 0.2 times the combined thickness 154, or between about 0.06 times and about 0.15 times the combined thickness 154, or between about 0.075 times and about 0.125 times the combined thickness 154, although various designs can be used. The thickness of the second raised frame layer 122 can be taken at the non-gradient portion 142.

Figure 31:
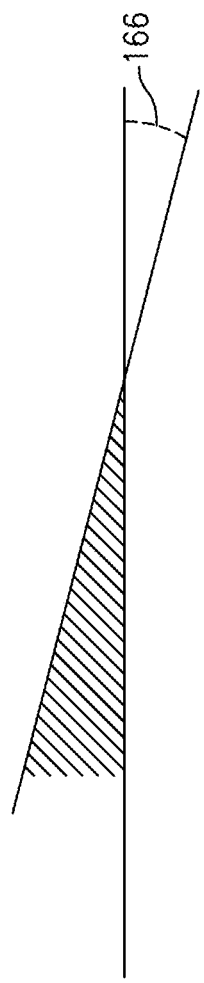
FIG. 31 shows an example gradient angle.

A gradient portion of the raised frame structure or components thereof can have a gradient angle 166 with respect to a horizontal direction in the illustrated embodiments. FIG. 31 shows the gradient angle 166. The angle 166 can be with respect to an underlying layer (e.g., a piezoelectric layer). The gradient portion of the first raised frame layer 120 can have an upper surface that is angled (e.g., downward or towards the piezoelectric layer 116 or lower electrode 114) by an angle 166. The gradient angle 166 of the first raised frame layer 120 can affect the layers above the first raised frame layer 120. The upper electrode 118, the second raised frame layer 122, and/or the passivation layer 124 can also have the gradient angle 166. The gradient angle 150 can be less than 90° or less than about 40°, in some embodiments. In some cases, the taper angle can be about 5°, about 10°, about 15°, about 20°, about 30°, about 45°, about 60°, about 75°, or any values therebetween, or any ranges between any of these values. For example, in some instances, the angle 166 can be in a range from about 10° to about 30° for a gradient portion of a raised frame layer in a gradient region, or for other associated layers. In some embodiments, different components can have different gradient angles 166. For example, as can be seen in FIG. 2, the gradient angle of the first raised frame layer 120 can be higher than the gradient angle for the second raised frame layer 120.

The BAW device can be a film bulk acoustic wave resonator (FBAR). A cavity 112 can be included, such as below the first electrode 114. The cavity 112 can be filled with air, in some implementations. The cavity 112 can be defined by the geometry of the first electrode 114 and the substrate 110. Although the BAW devices 100 illustrated in FIG. 2-4 are FBAR devices, any suitable principles and advantages discussed herein can be applied to a solidly mounted resonator (SMR).

Figure 32:
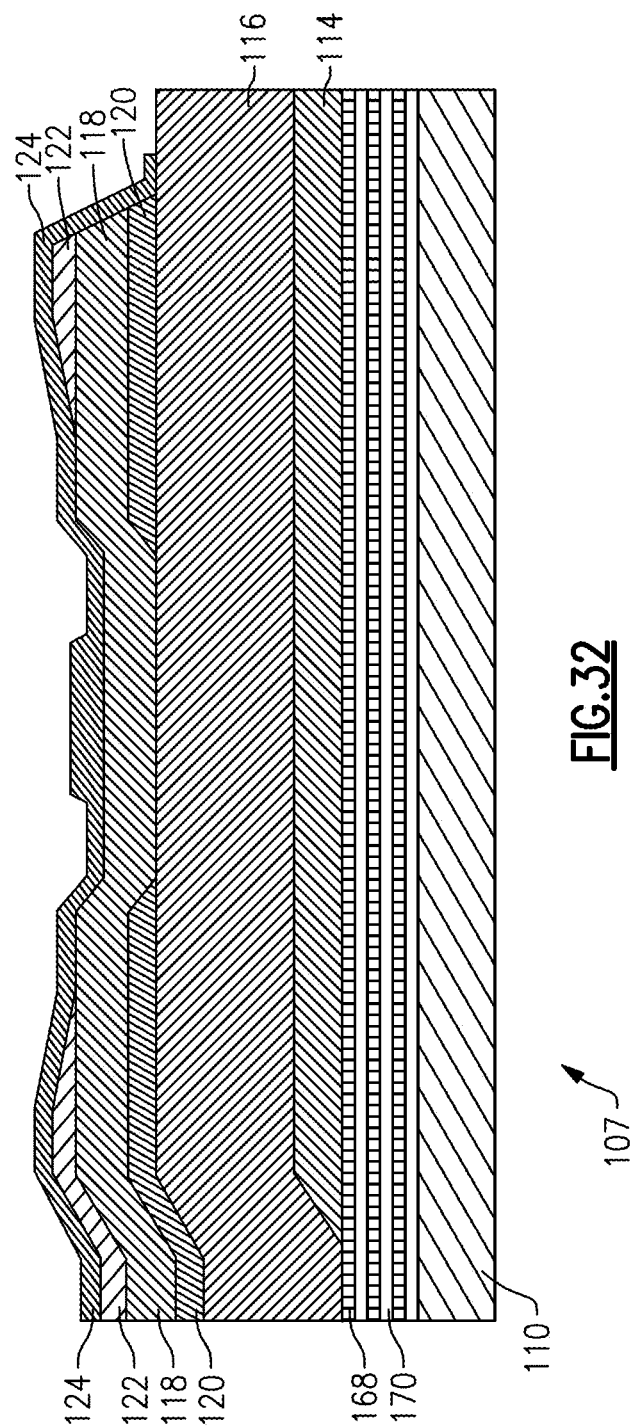
FIG. 32 is a cross-sectional view of another example embodiment of a raised frame bulk acoustic wave device.

FIG. 32 is a cross-sectional view of an example embodiment of a BAW device 107, which can be similar to the BAW device 100 of FIG. 2, except that the BAW device 100 is an SMR instead of an FBAR. In the BAW device 107 of FIG. 32, a solid acoustic mirror can be disposed between the first electrode 114 and a silicon substrate 110. The illustrated acoustic mirror includes acoustic Bragg reflectors. The illustrated acoustic Bragg reflectors include alternating low impedance layers 168 and high impedance layers 170. As an example, the Bragg reflectors can include alternating silicon dioxide layers as low impedance layers 168 and tungsten layers as high impedance layers 170, although other suitable materials could be used. The raised frame layer structure of the embodiment of FIG. 32 can have similar features and functionality to the raised frame structure in the embodiment of FIG. 2, or any other embodiments disclosed herein. The raised frame layer 120 in the embodiment of FIG. 32 can have similar features and functionality to the first raised frame layer 120 in the embodiment of FIG. 2. The first raised frame layer 120 in the embodiment of FIG. 32 can be wider than the second raised frame layer 122, as described in connection with FIG. 2.

Many other variations are possible. For example, the first raised frame layer 120 can be between the second electrode 118 and the piezoelectric layer 116, as shown in FIG. 2, for example. Alternatively, the first raised frame layer 120 can be between the first electrode 114 and the piezoelectric layer 116. The disclosure relating to the widths and thickness and other parameters of the first raised frame layer 120 can apply when the first raised frame layer 120 is between the lower electrode 114 and the piezoelectric layer 116. In some embodiments, the second raised frame layer 122 can be omitted. The disclosure relating to the widths and thickness and other parameters of the first raised frame layer 120 can apply when the second raised frame layer is omitted.

The various features of the BAW devices disclosed herein can be combined. For example, any of the BAW devices disclosed herein can be an SMR instead of an FBAR (e.g., as shown in FIG. 32). Any of the BAW devices disclosed herein can have the first raised frame layer 120 disposed between the lower electrode 114 and the piezoelectric layer 116. Any of the BAW devices can omit the second raised frame layer 122 (e.g., as shown in FIG. 14). Any of the BAW devices can omit the recessed frame region 136 or can omit the passivation layer 124. A BAW device 100 can include any combination of these features.

The BAW resonators disclosed herein can be implemented in acoustic wave filters. In certain applications, the acoustic wave filters can be band pass filters arranged to pass a radio frequency band and attenuate frequencies outside of the radio frequency band. Two or more acoustic wave filters can be coupled together at a common node and arranged as a multiplexer, such as a duplexer.

Figure 33:
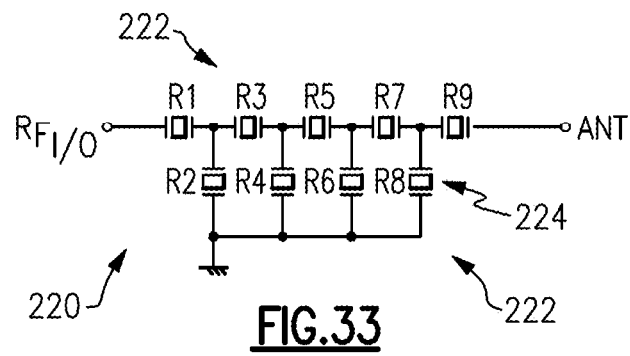
FIG. 33 is a schematic diagram of an example of an acoustic wave ladder filter.

FIG. 33 is a schematic diagram of an example of an acoustic wave ladder filter 220. The acoustic wave ladder filter 220 can be a transmit filter or a receive filter. The acoustic wave ladder filter 220 can be a band pass filter arranged to filter a radio frequency signal. The acoustic wave filter 220 can include series resonators 222 (R1, R3, R5, R7, and R9) and shunt resonators 224 (R2, R4, R6, and R8) coupled between a radio frequency input/output port RFI/O and an antenna port ANT. The radio frequency input/output port RFI/O can be a transmit port in a transmit filter or a receive port in a receive filter. The resonators 222, 224 can be positioned between any two RF input/output ports. One or more of the illustrated acoustic wave resonators 222, 224 can be a bulk acoustic wave resonator in accordance with any suitable principles and advantages discussed herein. An acoustic wave ladder filter can include any suitable number of series resonators and any suitable number of shunt resonators. The shunt resonators 224 can be coupled in parallel between the series resonators 222 and ground, and can be called parallel resonators in some cases.

Embodiments disclosed herein relate to utilizing various types of BAW devices in a filter to achieve higher performance than a filter that implement a single type of BAW device. In a band pass filter, the series resonators 222 (R1, R3, R5, R7, and R9) can include at least one first type of BAW resonator that includes a first raised frame structure and the shunt resonators 224 (R2, R4, R6, and R8) can include at least one second type of BAW resonator that includes a second raised frame structure that is different from the first raised frame structure. For example, the series resonators 222 (R1, R3, R5, R7, and R9) can include BAW resonators 100 according to the design disclosed in connection with FIG. 2, where the first raised frame layer 120 extends inward beyond the second raised frame layer 122. The shunt resonators 224 (R2, R4, R6, and R8) can include BAW resonators 103 according to the design disclosed in connection with FIG. 4, where the second raised frame layer 122 extends inward beyond the first raised frame layer 120. This arrangement is discussed and the filter response is shown in connection with FIG. 23. The shunt resonators 224 (R2, R4, R6, and R8) can use other BAW resonators disclosed herein or other BAW designs as well, in some embodiments.

In a band rejection filter, the shunt resonators 224 (R2, R4, R6, and R8) can include at least one first type BAW resonator that includes a first raised frame structure and the series resonators 222 (R1, R3, R5, R7, and R9) can include at least one second type BAW resonator that include a second raised frame structure. The second raised framed structure is different than the first raised frame structure. For example, the series resonators 222 (R1, R3, R5, R7, and R9) can include BAW resonators 103 according to the design disclosed in connection with FIG. 4, where the second raised frame layer 122 extends inward beyond the first raised frame layer 120. The shunt resonators 224 (R2, R4, R6, and R8) can include BAW resonators 100 according to the design disclosed in connection with FIG. 2, where the first raised frame layer 120 extends inward beyond the second raised frame layer 122. The series resonators 222 (R1, R3, R5, R7, and R9) can use other BAW resonators disclosed herein or other BAW designs as well, in some embodiments.

The first raised framed structure can be different from the second raised frame structure. The series bulk acoustic wave resonator(s) can have a first resonant frequency and/or a first anti-resonant frequency. The shunt bulk acoustic wave resonator(s) can have a second resonant frequency and/or a second anti-resonant frequency. In some embodiments, the second raised frame structure contributes to the series bulk acoustic wave resonator having a higher quality factor below the second resonant frequency than the shunt bulk acoustic wave resonator has below the first resonant frequency.

An acoustic wave filter can be arranged in any other suitable filter topology, such as a lattice topology or a hybrid ladder and lattice topology. A bulk acoustic wave resonator in accordance with any suitable principles and advantages disclosed herein can be implemented in a band pass filter. In some other applications, a bulk acoustic wave resonator in accordance with any suitable principles and advantages disclosed herein can be implemented in a band stop or band rejection filter.

Figure 34:
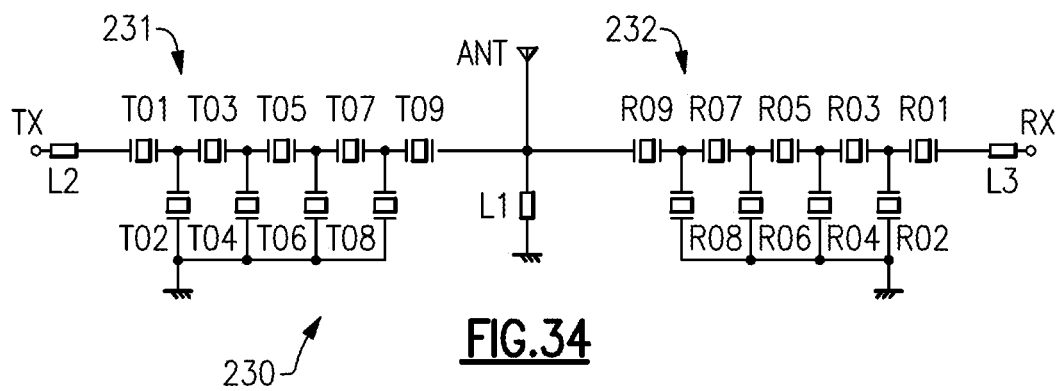
FIG. 34 is a schematic diagram of an example of a duplexer.

FIG. 34 is a schematic diagram of an example of a duplexer 230. The duplexer 230 can include a transmit filter 231 and a receive filter 232 coupled to each other at an antenna node ANT. A shunt inductor L1 can be connected to the antenna node ANT. The transmit filter 231 and the receive filter 232 can both be acoustic wave ladder filters in the duplexer 230.

The transmit filter 131 can filter a radio frequency signal and provide a filtered radio frequency signal to the antenna node ANT. A series inductor L2 can be coupled between a transmit input node TX and the acoustic wave resonators of the transmit filter 131. The illustrated transmit filter 131 can include acoustic wave resonators T01 to T09. One or more of these resonators can be bulk acoustic wave resonator in accordance with any suitable principles and advantages disclosed herein. The illustrated receive filter can include acoustic wave resonators R01 to R09. One or more of these resonators can be a bulk acoustic wave resonator in accordance with any suitable principles and advantages disclosed herein. The receive filter can filter a radio frequency signal received at the antenna node ANT. A series inductor L3 can be coupled between the resonator and a receive output node RX. The receive output node RX of the receive filter provides a radio frequency receive signal.

Figure 35:
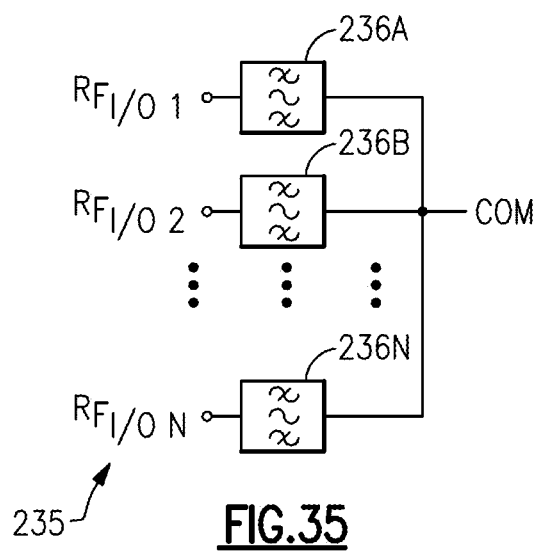
FIG. 35 is a schematic diagram of an example of a multiplexer.

FIG. 35 is a schematic diagram of a multiplexer 235 that includes an acoustic wave filter according to an embodiment. The multiplexer 235 can include a plurality of filters 236A to 236N coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters. Each of the illustrated filters 236A, 236B, and 236N can be coupled between the common node COM and a respective input/output node RFI/O1, RFI/O2, and RFI/ON.

In some instances, all filters of the multiplexer 235 can be receive filters. According to some other instances, all filters of the multiplexer 235 can be transmit filters. In various applications, the multiplexer 235 can include one or more transmit filters and one or more receive filters. Accordingly, the multiplexer 235 can include any suitable number of transmit filters and any suitable number of receive filters.

Each of the illustrated filters can be band pass filters having different respective pass bands.

The multiplexer 235 is illustrated with hard multiplexing with the filters 236A to 236N having fixed connections to the common node COM. In some other applications, one or more of the filters of a multiplexer can be electrically connected to the common node by a respective switch. Any of such filters can include a bulk acoustic wave resonator according to any suitable principles and advantages disclosed herein.

A first filter 236A can be an acoustic wave filter having a first pass band and arranged to filter a radio frequency signal. The first filter 236A can include one or more bulk acoustic wave resonators according to any suitable principles and advantages disclosed herein. A second filter 236B has a second pass band. In some embodiments, a raised frame structure of one or more bulk acoustic wave resonators of the first filter 236A can move a raised frame mode of the one or more bulk acoustic wave resonators away from the second passband. This can increase a reflection coefficient (Gamma) of the first filter 236A in the pass band of the second filter 236B. The raised frame structure of the bulk acoustic wave resonator of the first filter 236A can also move the raised frame mode away from the passband of one or more other filters of the multiplexer 235.

In certain instances, the common node COM of the multiplexer 235 can be arranged to receive a carrier aggregation signal including at least a first carrier associated with the first passband of the first filter 236A and a second carrier associated with the second passband of the second filter 236B. A multi-layer raised frame structure of a bulk acoustic wave resonator of the first filter 236A can maintain and/or increase a reflection coefficient of the first filter 236A in the second passband of the second filter 236B that is associated with the second carrier of the carrier aggregation signal.

The filters 236B to 236N of the multiplexer 235 can include one or more acoustic wave filters, one or more acoustic wave filters that include at least one bulk acoustic wave resonator with a raised frame structure, one or more LC filters, one or more hybrid acoustic wave LC filters, or any suitable combination thereof.

The raised frame bulk acoustic wave resonators disclosed herein can be implemented in a variety of packaged modules. Some example packaged modules will now be discussed in which any suitable principles and advantages of the bulk acoustic wave devices disclosed herein can be implemented. The example packaged modules can include a package that encloses the illustrated circuit elements. The illustrated circuit elements can be disposed on a common packaging substrate. The packaging substrate can be a laminate substrate, for example. FIGS. 12, 13A, 13B, and 14 are schematic block diagrams of illustrative packaged modules according to certain embodiments. Certain example packaged modules can include one or more radio frequency amplifiers, such as one or more power amplifiers and/or one or more low noise amplifiers. Any suitable combination of features of these modules can be implemented with each other. While duplexers are illustrated in the example packaged modules of FIGS. 12, 13A, and 14, any other suitable multiplexer that includes a plurality of acoustic wave filters coupled to a common node can be implemented instead of one or more duplexers. For example, a quadplexer can be implemented in certain applications. Alternatively or additionally, one or more filters of a packaged module can be arranged as a transmit filter or a receive filter that is not included in a multiplexer.

Figure 36:
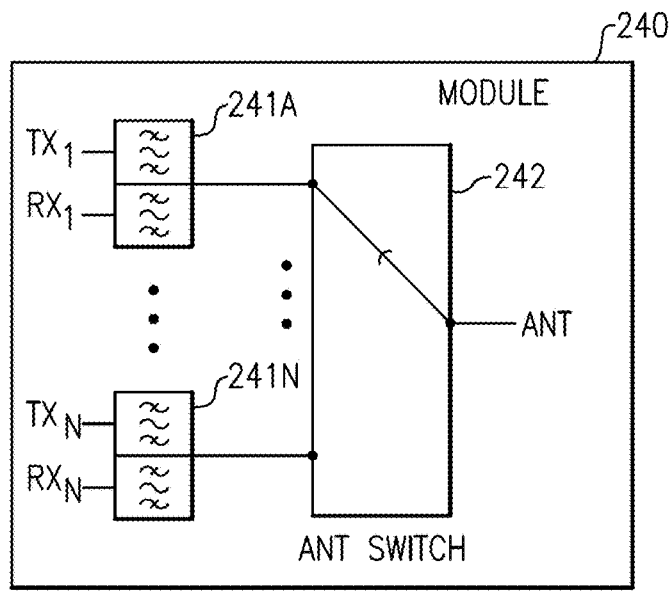
FIG. 36 is a schematic block diagram of a module that includes an antenna switch and duplexers that include one or more raised frame bulk acoustic wave devices.

FIG. 36 is a schematic block diagram of an example module 240 that includes duplexers 241A to 241N and an antenna switch 242. One or more filters of the duplexers 241A to 241N can include any suitable number of multi-layer raised frame bulk acoustic wave resonators in accordance with any suitable principles and advantages discussed herein. Any suitable number of duplexers 241A to 241N can be implemented. The antenna switch 242 can have a number of throws corresponding to the number of duplexers 241A to 241N. The antenna switch 242 can electrically couple a selected duplexer to an antenna port of the module 240.

Figure 37A:
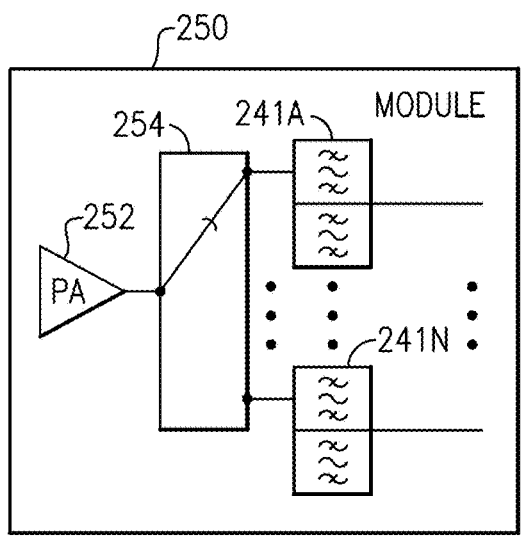
FIG. 37A is a schematic block diagram of a module that includes a power amplifier, a radio frequency switch, and duplexers that include one or more raised frame bulk acoustic wave devices.

FIG. 37A is a schematic block diagram of an example module 250 that includes a power amplifier 252, a radio frequency switch 254, and duplexers 241A to 241N in accordance with one or more embodiments. The power amplifier 252 can amplify a radio frequency signal. The radio frequency switch 254 can be a multi-throw radio frequency switch. The radio frequency switch 254 can electrically couple an output of the power amplifier 252 to a selected transmit filter of the duplexers 241A to 241N. One or more filters of the duplexers 241A to 241N can include any suitable number of raised frame bulk acoustic wave resonators in accordance with any suitable principles and advantages discussed herein. Any suitable number of duplexers 241A to 241N can be implemented.

Figure 37B:
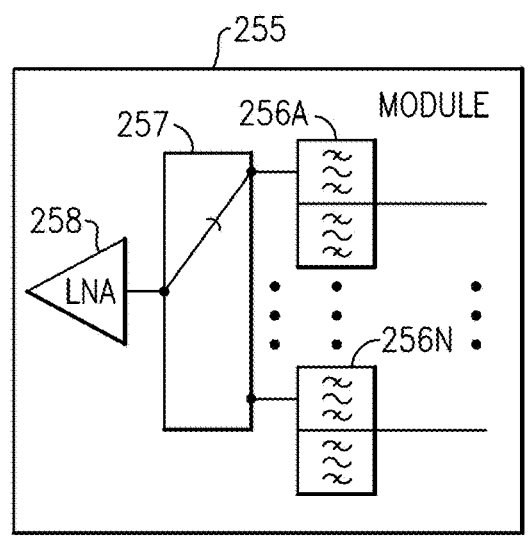
FIG. 37B is a schematic block diagram of a module that includes a low noise amplifier, a radio frequency switch, and acoustic wave filters t include one or more raised frame bulk acoustic wave devices.

FIG. 37B is a schematic block diagram of an example module 255 that includes filters 256A to 256N, a radio frequency switch 257, and a low noise amplifier 258 according to one or more embodiments. One or more filters of the filters 256A to 256N can include any suitable number of raised frame bulk acoustic wave resonators in accordance with any suitable principles and advantages disclosed herein. Any suitable number of filters 256A to 256N can be implemented. The illustrated filters 256A to 256N can be receive filters. In some embodiments (not illustrated), one or more of the filters 256A to 256N can be included in a multiplexer that also includes a transmit filter. The radio frequency switch 257 can be a multi-throw radio frequency switch. The radio frequency switch 257 can electrically couple an output of a selected filter of filters 256A to 256N to the low noise amplifier 257. In some embodiments (not illustrated), a plurality of low noise amplifiers can be implemented. The module 255 can include diversity receive features in certain applications.

Figure 38:
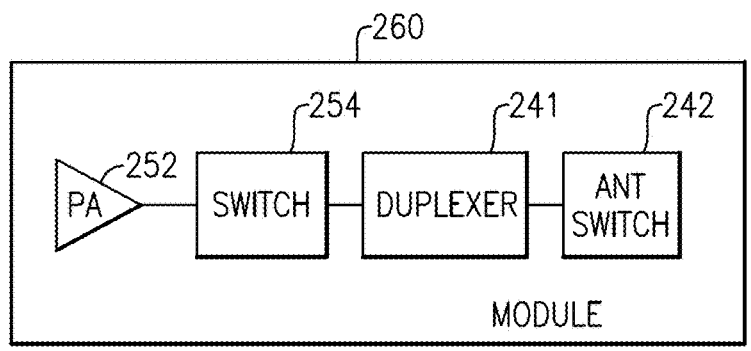
FIG. 38 is a schematic block diagram of a module that includes a power amplifier, a radio frequency switch, a duplexer that includes one or more raised frame bulk acoustic wave devices.

FIG. 38 is a schematic block diagram of an example module 260 that includes a power amplifier 252, a radio frequency switch 254, and a duplexer 241 that includes a raised frame bulk acoustic wave device in accordance with one or more embodiments, and an antenna switch 242. The module 260 can include elements of the module 240 and elements of the module 250.

Figure 39A:
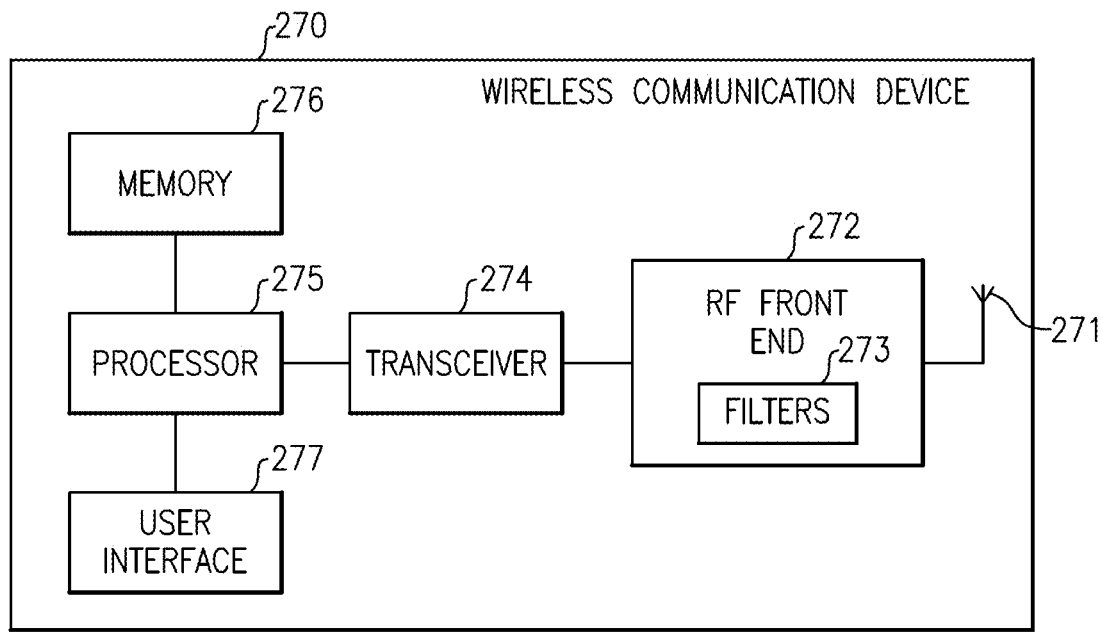
FIG. 39A is a schematic block diagram of a wireless communication device that includes filters that include one or more raised frame bulk acoustic wave devices.

One or more filters with any suitable number of raised frame bulk acoustic devices can be implemented in a variety of wireless communication devices. FIG. 39A is a schematic block diagram of an example wireless communication device 270 that includes a filter 273 with one or more raised frame bulk acoustic wave resonators in accordance with any suitable principles and advantages disclosed herein. The wireless communication device 270 can be any suitable wireless communication device. For instance, a wireless communication device 270 can be a mobile phone, such as a smart phone. As illustrated, the wireless communication device 270 includes an antenna 271, a radio frequency (RF) front end 272 that includes filter 273, an RF transceiver 274, a processor 275, a memory 276, and a user interface 277. The antenna 271 can transmit RF signals provided by the RF front end 272. The antenna 271 can provide received RF signals to the RF front end 272 for processing.

The RF front end 272 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 272 can transmit and receive RF signals associated with any suitable communication standards. Any of the multi-layer raised frame bulk acoustic wave resonators disclosed herein can be implemented in filters 273 of the RF front end 272.

The RF transceiver 274 can provide RF signals to the RF front end 272 for amplification and/or other processing. The RF transceiver 274 can also process an RF signal provided by a low noise amplifier of the RF front end 272. The RF transceiver 274 is in communication with the processor 275. The processor 275 can be a baseband processor. The processor 275 can provide any suitable base band processing functions for the wireless communication device 270. The memory 276 can be accessed by the processor 275. The memory 276 can store any suitable data for the wireless communication device 270. The processor 275 is also in communication with the user interface 277. The user interface 277 can be any suitable user interface, such as a display.

Figure 39B:
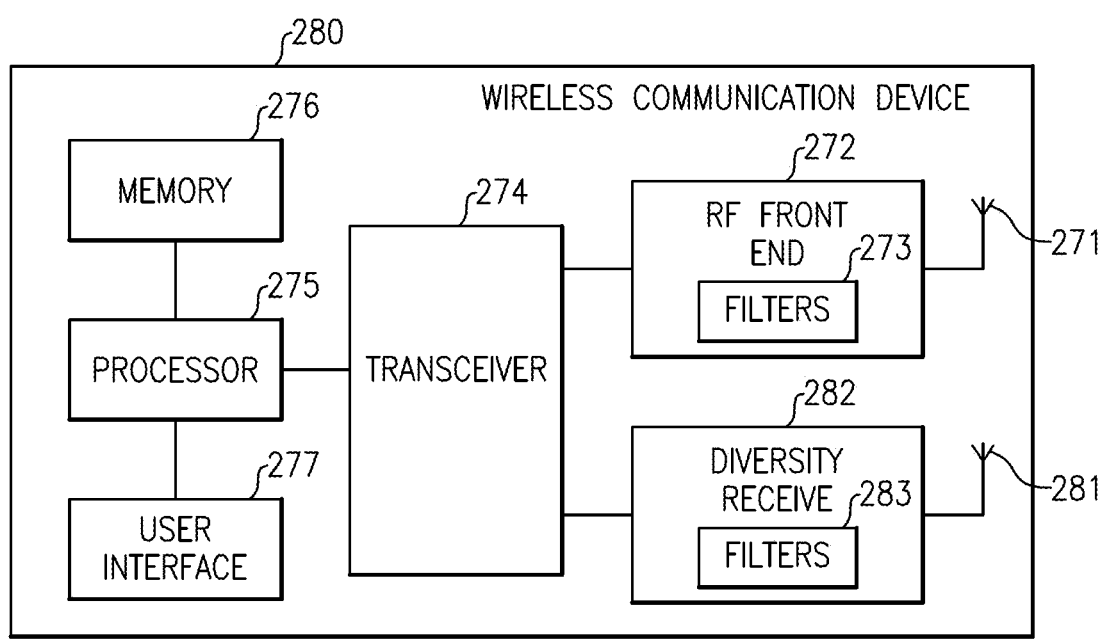
FIG. 39B is a schematic block diagram of another wireless communication device that includes filters that include one or more raised frame bulk acoustic wave devices.

FIG. 39B is a schematic diagram of a wireless communication device 280 that includes filters 273 in a radio frequency front end 272 and second filters 283 in a diversity receive module 282. The wireless communication device 280 is like the wireless communication device 270 of FIG. 39A, except that the wireless communication device 280 also includes diversity receive features. As illustrated in FIG. 39B, the wireless communication device 280 can include a diversity antenna 281, a diversity module 282 configured to process signals received by the diversity antenna 281 and including filters 283, and a transceiver 274 in communication with both the radio frequency front end 272 and the diversity receive module 282. One or more of the second filters 283 can include a bulk acoustic wave resonator with a multi-layer raised frame structure in accordance with any suitable principles and advantages disclosed herein.

Bulk acoustic wave devices disclosed herein can be included in a filter and/or a multiplexer arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. A filter arranged to filter a radio frequency signal in a 5G NR FR1 operating band can include one or more bulk acoustic wave resonators be implemented in accordance with any suitable principles and advantages disclosed herein.

5G NR carrier aggregation specifications can present technical challenges. For example, 5G carrier aggregations can have wider bandwidth and/or channel spacing than fourth generation (4G) Long Term Evolution (LTE) carrier aggregations. Carrier aggregation bandwidth in certain 5G FR1 applications can be in a range from 120 MHz to 400 MHz, such as in a range from 120 MHz to 200 MHz. Carrier spacing in certain 5G FR1 applications can be up to 100 MHz. Bulk acoustic wave resonators with a raised frame structure as disclosed herein can achieve low insertion loss and low Gamma loss, in some embodiments. The frequency of a raised frame mode of such a bulk acoustic wave resonator can be moved significantly away from a resonant frequency of the bulk acoustic wave resonator. Accordingly, the raised frame mode can be outside of a carrier aggregation band even with the wider carrier aggregation bandwidth and/or channel spacing within FR1 in 5G specifications. This can reduce and/or eliminate Gamma degradation in an operating band of another carrier of a carrier aggregation. In some instances, Gamma can be increased in the operating band of the other carrier of the carrier aggregation.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure.

Indeed, the novel resonators, devices, modules, apparatus, methods, and systems described herein may be embodied in a variety of other forms. Furthermore, various omissions, substitutions and changes in the form of the resonators, devices, modules, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

The following is claimed:

1. A bulk acoustic wave device comprising:
   a first electrode;
   a second electrode;
   piezoelectric layer between the first electrode and the second electrode; and
   a raised frame structure including a first raised frame layer and a second raised frame layer, the second raised frame layer having a higher acoustic impedance than the first raised frame layer, the second raised frame layer overlapping a portion of the first raised frame layer, the first raised frame layer extending further inward than the second raised frame layer, and the second raised frame layer having a thickness between about 0.02 and about 0.4 times a combined thickness of the first electrode, the piezoelectric layer, and the second electrode.

2. The bulk acoustic wave device of claim 1, wherein the first raised frame layer extends further inward than the second raised frame layer by a distance that is between about 50% and about 100% of the combined thickness of the first electrode, the piezoelectric layer, and the second electrode.

3. The bulk acoustic wave device of claim 1, wherein the first raised frame layer includes a non-gradient portion with a substantially uniform thickness and a gradient portion with a tapered thickness, and the non-gradient portion of the first raised frame layer extends further inward than the second raised frame layer.

4. The bulk acoustic wave device of claim 1, wherein the first raised frame layer includes a non-gradient portion with a substantially uniform thickness and a gradient portion with a tapered thickness, and the non-gradient portion of the first raised frame layer has a width that is larger than the combined thickness of the first electrode, the piezoelectric layer, and the second electrode.

5. The bulk acoustic wave device of claim 4, wherein the width of the non-gradient portion of the first raised frame layer is between about 1.5 times and about 2.5 times the combined thickness of the first electrode, the piezoelectric layer, and the second electrode.

6. The bulk acoustic wave device of claim 1, wherein the first raised frame layer includes a non-gradient portion with a substantially uniform thickness and a gradient portion with a tapered thickness, the second raised frame layer includes a non-gradient portion with a substantially uniform thickness and a gradient portion with a tapered thickness, and the non-gradient portion of the first raised frame layer is wider than the non-gradient portion of the second raised frame layer.

7. The bulk acoustic wave device of claim 6, wherein a width of the non-gradient portion of the first raised frame layer is about 2 times to about 8 times a width of the non-gradient portion of the second raised frame layer.

8. The bulk acoustic wave device of claim 1, wherein the first raised frame layer includes a non-gradient portion with a substantially uniform thickness and a gradient portion with a tapered thickness, the second raised frame layer includes a non-gradient portion with a substantially uniform thickness and a gradient portion with a tapered thickness, and the non-gradient portion of the first raised frame layer extends further inward than the gradient portion of the second raised frame layer by a distance that is between about 25% and about 75% of the combined thickness of the first electrode, the piezoelectric layer, and the second electrode.

9. The bulk acoustic wave device of claim 1, wherein the first raised frame layer has a thickness between about 0.02 to about 0.4 times the combined thickness of the first electrode, the piezoelectric layer, and the second electrode.

10. The bulk acoustic wave device of claim 1, comprising an active region where the first electrode overlaps the second electrode, the active region including a middle area, and the raised frame structure positioned outside the middle area of the active region, the combined thickness of the first electrode, the piezoelectric layer, and the second electrode being taken at the middle area of the active region.

11. The bulk acoustic wave device of claim 1, wherein the first raised frame layer is between the first electrode and the second electrode, the piezoelectric layer is over the first electrode, the second electrode is over the piezoelectric layer, and the first raised frame layer is between the second electrode and the piezoelectric layer.

12. The bulk acoustic wave device of claim 11, wherein the second raised frame layer is over the second electrode.

13. The bulk acoustic wave device of claim 1, wherein the first raised frame layer is between the first electrode and the second electrode, the piezoelectric layer is over the first electrode, the second electrode is over the piezoelectric layer, and the first raised frame layer is between the first electrode and the piezoelectric layer.

14. The bulk acoustic wave device of claim 13, wherein the second raised frame layer is over the second electrode.

15. A bulk acoustic wave device comprising:
   a first electrode;
   a second electrode;
   a piezoelectric layer between the first electrode and the second electrode; and
   a raised frame structure that includes a raised frame layer having a lower acoustic impedance than at least one of the first electrode, the second electrode, and the piezoelectric layer, and a width of the raised frame layer that overlaps the first and second electrodes is between about 2 times and about 3 times a combined thickness of the first electrode, the piezoelectric layer, and the second electrode.

16. The bulk acoustic wave device of claim 15, wherein the raised frame layer includes a non-gradient portion with a substantially uniform thickness and a gradient portion with a tapered thickness, and the non-gradient portion of the raised frame layer has a width that is larger than the combined thickness of the first electrode, the piezoelectric layer, and the second electrode.

17. The bulk acoustic wave device of claim 16, wherein width of the non-gradient portion of the raised frame layer is between about 1.5 times and about 2.5 times the combined thickness of the first electrode, the piezoelectric layer, and the second electrode.

18. The bulk acoustic wave device of claim 15, wherein the raised frame layer has a thickness between about 0.02 to about 0.4 times the combined thickness of the first electrode, the piezoelectric layer, and the second electrode.

19. A bulk acoustic wave device comprising:
a first electrode;
a second electrode;
a piezoelectric layer between the first electrode and the second electrode; and
a raised frame structure that includes a raised frame layer having a lower acoustic impedance than at least one of the first electrode, the second electrode, and the piezoelectric layer, a width of the raised frame layer that overlaps the first and second electrodes is between about 1.5 times and about 4 times a combined thickness of the first electrode, the piezoelectric layer, and the second electrode, and the raised frame layer has a thickness between about 0.06 to about 0.15 times the combined thickness of the first electrode, the piezoelectric layer, and the second electrode.

20. A bulk acoustic wave device comprising:
a first electrode;
a second electrode;
a piezoelectric layer between the first electrode and the second electrode; and
a raised frame structure that includes a raised frame layer having a lower acoustic impedance than at least one of the first electrode, the second electrode, and the piezoelectric layer, a width of the raised frame layer that overlaps the first and second electrodes is between about 1.5 times and about 4 times a combined thickness of the first electrode, the piezoelectric layer, and the second electrode, the raised frame layer is between the first electrode and the second electrode, the piezoelectric layer is over the first electrode, the second electrode is over the piezoelectric layer, and the raised frame layer is between the second electrode and the piezoelectric layer.

21. A bulk acoustic wave device comprising:
a first electrode;
a second electrode;
a piezoelectric layer between the first electrode and the second electrode; and
a raised frame structure that includes a raised frame layer having a lower acoustic impedance than at least one of the first electrode, the second electrode, and the piezoelectric layer, a width of the raised frame layer that overlaps the first and second electrodes is between about 1.5 times and about 4 times a combined thickness of the first electrode, the piezoelectric layer, and the second electrode, the raised frame layer is between the first electrode and the second electrode, the piezoelectric layer is over the first electrode, the second electrode is over the piezoelectric layer, and the raised frame layer is between the first electrode and the piezoelectric layer.

22. A bulk acoustic wave device comprising:
a first electrode;
a second electrode;
a piezoelectric layer between the first electrode and the second electrode; and
a raised frame structure that includes a raised frame layer having a lower acoustic impedance than at least one of the first electrode, the second electrode, and the piezoelectric layer, a width of the raised frame layer that overlaps the first and second electrodes is between about 1.5 times and about 4 times a combined thickness of the first electrode, the piezoelectric layer, and the second electrode, and the raised frame structure includes an additional raised frame layer that has higher acoustic impedance than the raised frame layer.

23. The bulk acoustic wave device of claim 22, wherein the raised frame layer extends further inward than the additional raised frame layer.

24. The bulk acoustic wave device of claim 23, wherein the raised frame layer extends further inward than the additional raised frame layer by a distance that is between about 50% and about 100% of the combined thickness of the first electrode, the piezoelectric layer, and the second electrode.

* * * * *